(12) United States Patent
Ryu

(10) Patent No.: US 9,032,268 B1
(45) Date of Patent: May 12, 2015

(54) METHOD FOR ERROR CORRECTION IN A MULTICAST NETWORK

(71) Applicant: Seung Moon Ryu, Seongnam-Si (KR)

(72) Inventor: Seung Moon Ryu, Seongnam-Si (KR)

( * ) Notice: Subject to any disclaimer, the term of this patent is extended or adjusted under 35 U.S.C. 154(b) by 11 days.

(21) Appl. No.: 14/045,256

(22) Filed: Oct. 3, 2013

Related U.S. Application Data

(63) Continuation-in-part of application No. 14/039,977, filed on Sep. 27, 2013, and a continuation-in-part of application No. 14/040,030, filed on Sep. 27, 2013, and a continuation-in-part of application No. 14/040,062, filed on Sep. 27, 2013, now abandoned, and a continuation-in-part of application No. 14/040,096, filed on Sep. 27, 2013, now abandoned, and a continuation-in-part of application No. 14/040,127, filed on Sep. 27, 2013.

(60) Provisional application No. 61/876,054, filed on Sep. 10, 2013.

(51) Int. Cl.
| | | |
|---|---|---|
| *H03M 13/00* | (2006.01) | |
| *H03M 13/03* | (2006.01) | |
| *H04L 1/00* | (2006.01) | |
| *H03M 13/11* | (2006.01) | |
| *H04J 13/00* | (2011.01) | |

(52) U.S. Cl.
CPC ........... *H04L 1/0041* (2013.01); *H03M 13/116* (2013.01); *H04J 13/004* (2013.01)

(58) Field of Classification Search
CPC .......... H03M 13/116; H03M 13/1105; H03M 13/6516; H04J 13/0044; H04J 13/004
USPC ......... 714/759, 758, 793, 786, 799, 752, 737, 714/746
See application file for complete search history.

(56) References Cited

U.S. PATENT DOCUMENTS

| | | | | |
|---|---|---|---|---|
| 6,560,291 | B1 * | 5/2003 | Piret et al. ..................... | 375/259 |
| 6,700,864 | B1 * | 3/2004 | Gerakoulis et al. ........... | 370/208 |
| 6,704,494 | B1 * | 3/2004 | Chujoh et al. ................ | 386/253 |
| 2003/0165272 | A1 * | 9/2003 | Akaogi ........................ | 382/239 |
| 2012/0155402 | A1 * | 6/2012 | Kim et al. ..................... | 370/329 |

* cited by examiner

*Primary Examiner* — Christine Tu
(74) *Attorney, Agent, or Firm* — James Harrison

(57) ABSTRACT

A digital broadcast communication system includes an upload system further comprising digital transceivers that upload a plurality of voice sources from any one of announcers, players, referees, coaches, and sportscasters from a broadcast booth utilizing a synchronized multicast communication protocol. At least one access point is configured to communicate with the digital transceivers using synchronized multicast communication protocol. The system utilizes error control coding and decoding that is based upon a quasi-orthogonal maximal sequence code.

19 Claims, 31 Drawing Sheets

METHOD FOR ERROR CORRECTION IN A MULTICAST NETWORK

CROSS REFERENCE TO RELATED APPLICATIONS

The present application is related to and claims priority to Provisional Application for Patent entitled CONTAINER STRUCTURE AND PROTOCOL FOR WIRELESS COMMUNICATIONS having an application number of 61/876,054 and a filing date of Sep. 10, 2013 an further claims priority as a Continuation-in-Part application to the following applications, all filed on Sep. 27, 2013:
1) an application entitled Large Venue Wireless Communications having an application number of Ser. No. 14/039,977; 2) an application entitled Method for Container Structure Communications having an application number of Ser. No. 14/040,030; 3) an application entitled System and Apparatus for Container Structured Communications having an application number of Ser. No. 14/040,062; 4) an application entitled Method and Apparatus for Wireless Packet Network having an application number of Ser. No. 14/040,096; and 5) an application entitled Method and Apparatus for Mixed WLAN Communications having an application number of Ser. No. 14/040,127.

BACKGROUND OF THE INVENTION

1. Technical Field of the Invention

This invention relates generally to wireless communication systems and more particularly to radio frequency integrated circuits used in such wireless communication systems.

2. Description of Related Art

Wired and wireless communication systems are known to support communications between wireless and wire lined communication devices. Such communication systems range from national and/or international cellular telephone systems to the Internet to point-to-point in-home wireless networks. Each type of communication system typically is constructed, and hence typically operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the wireless communication devices utilize common channels (e.g., one of a plurality of radio frequency (RF) carriers of the wireless communication system) and communicate over those common channel(s). For indirect wireless communications, each wireless device communicates directly with an access point (AP) or associated base station (e.g., for cellular services) via an assigned channel. To complete a communication connection between the wireless devices, the associated base stations and/or associated access points communicate with each other directly, via a system controller, utilizing a public switch telephone network (PSTN), via a wide area network such as the Internet, and/or via another public or private packet data network.

For each wireless communication device to participate in wireless communications, it usually includes a built-in radio transceiver (i.e., receiver and transmitter) that is coupled to an associated radio transceiver (e.g., a station for in-home and/or in-building wireless communication networks, RF modem, etc.). As is known, the transmitter includes a data modulation stage, one or more intermediate frequency (IF) stages, and a power amplifier. The data modulation stage converts raw data into baseband signals in accordance with a particular wireless communication standard. The one or more IF stages up convert the baseband signals with one or more local oscillations to produce RF signals. The power amplifier amplifies the RF signals prior to transmission via an antenna.

As is also known, the receiver is coupled to the antenna and includes a low noise amplifier, one or more IF stages, a filtering stage, and a data recovery stage. The low noise amplifier receives inbound RF signals via the antenna and amplifies them. The one or more IF stages mix the amplified RF signals with one or more local oscillations to convert the amplified RF signal into baseband signals or IF signals. The filtering stage filters the baseband signals or the IF signals to attenuate unwanted out-of-band signals to produce filtered signals. The data recovery stage recovers raw data from the filtered signals in accordance with the particular wireless communication standard.

The need for wireless networking has, heretofore, been addressed by various standards bodies that promulgate interworking standards. The IEEE 802.11 standard that defines a wireless LAN. In a typical 802.11 wireless LAN, a wired backbone couples to one or more wireless access points (WAPs) that wirelessly connect to many computers or other electronic devices that contain wireless interfaces. IEEE 802.11 networks have achieved significant success in servicing wireless communication needs for portable computers, portable data terminals, and other wireless devices that transmit and receive data.

Wireless personal area networks (WPANs) enable short-range "ad-hoc" connectivity among portable consumer electronics and communication devices but do not require the infrastructure needed for an 802.11 network. The WPAN™ Study Group (SG) was formed on Mar. 12, 1998 by the IEEE 802.11 Working Group to investigate the need for a supplemental wireless network standard worked to create protocols for low power, low complexity, wireless connectivity among devices within or entering a device proximity. This includes devices that are carried, worn, or located near the body. These activities have led to the development of 802.15, which is a WPAN standard. These devices, however, typically support only paired communications between two devices.

Another known WPAN is Bluetooth. For both Bluetooth and 802.15 WPANs, the coverage area for a WPAN is generally within a 10-meter radius. In other words, a personal operating space (POS) is the space about a person that typically extends up to 10 meters in all directions and envelops the person whether stationary or in motion. It is within the POS that the portable device communicates with an access point. The Bluetooth radio system has emerged as the first technology addressing WPAN applications with its salient features of low power consumption, small package size, and low cost. Raw data rates for Bluetooth devices are limited to 1 Mbps, although the actual throughput is about half of the raw data rate.

A Bluetooth communication link supports up to three voice channels with very limited additional bandwidth for bursty data traffic. However, Bluetooth communication links cannot support the data transfer requirements of portable consumer electronics devices that transmit and receive multimedia data, e.g., high quality video applications, audio applications, and multi-megabyte file transfers for music and image files. In a typical Bluetooth communication channel, one of two paired devices establishes itself as a master to control communications with the other device, which, for that pairing, is the slave device.

Among other reasons, the above referenced systems are limited to paired communications between devices. For WLAN and cellular, all communications go through a network controller. For PAN systems that support peer-to-peer communications, those communications are also limited to a small number of devices (typically two). Even if the standard protocols supported peer-to-peer communications between multiple devices, interference and other problems make it difficult for such systems to proliferate in a reliable manner.

Therefore, a need exists for protocol and/or technology that support peer-to-peer communications between multiple devices in a manner that can reliably solve interference and related problems and that can support broadcast transmissions.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
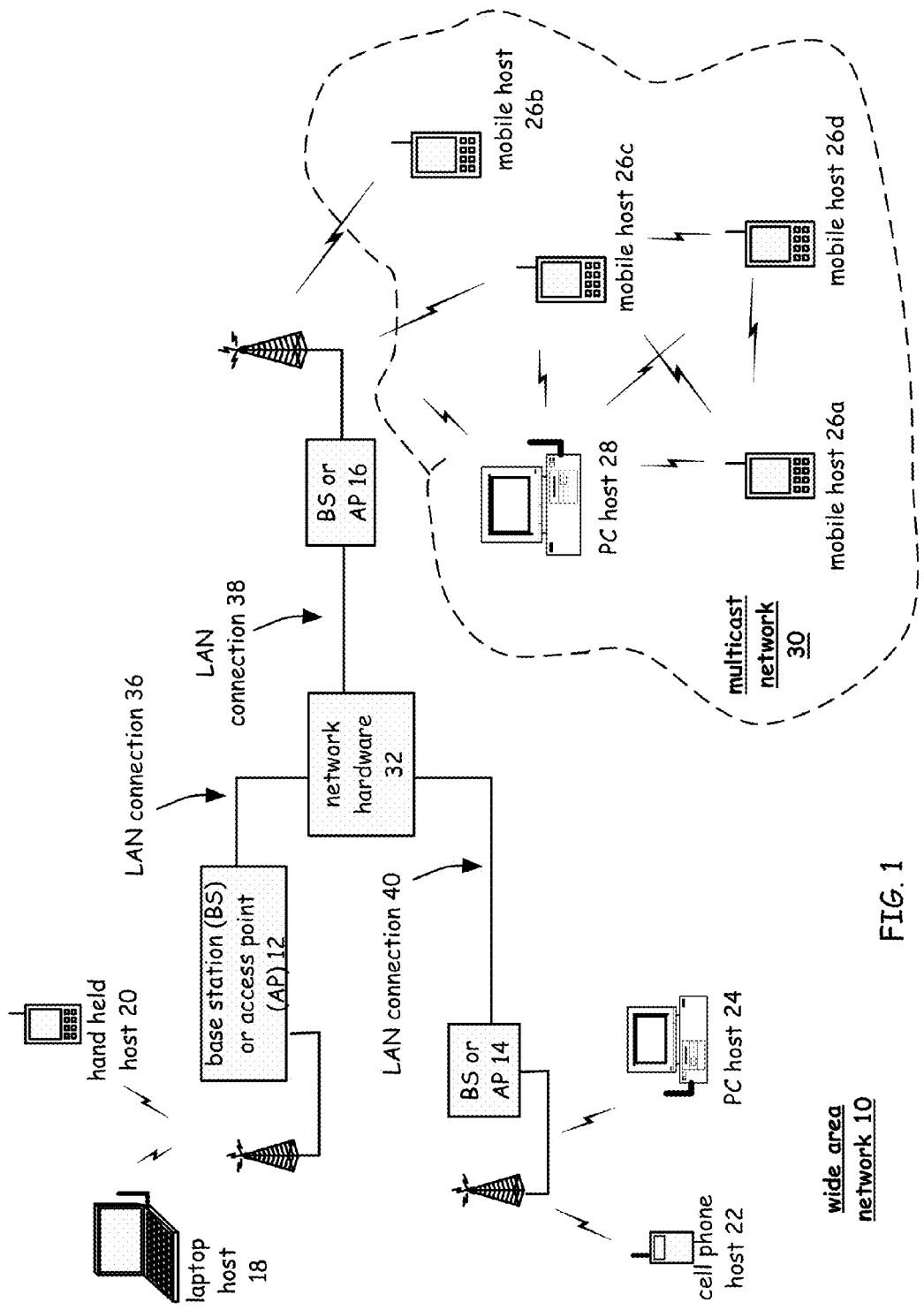
FIG. 1 is a functional diagram of a wide area network according to one embodiment that includes a multicast network.

FIG. 1 is a functional diagram of a wide area network according to one embodiment that includes a multicast network. A communication system 10 is a wide area communication network that includes a plurality of base stations or access points 12-16, a plurality of wireless communication devices 18-28, some of which are part of a multicast network 30, and a network hardware component 32. The wireless communication devices 18-28 may be laptop host computers 18, personal digital assistant hosts 20, personal computer hosts 24 and 28 and/or cellular telephone hosts 22. The details of the wireless communication devices will be described in greater detail with reference to FIGS. 4-5.

The base stations or access points 12-16 are operably coupled to the network hardware 34 via local area network connections 36, 38 and 40. The network hardware 34, which may be a router, switch, bridge, modem, system controller, etc., provides a wide area network connection for the communication system 10. Each of the base stations or access points 12-16 has an associated antenna or antenna array to communicate with the wireless communication devices in its area. Typically, the wireless communication devices register with a particular base station or access point 12-16 to receive services from the communication system of wide area network 10. For direct connections (i.e., point-to-point communications), wireless communication devices in multicast network 30 communicate directly via a multicast communication protocol according to one embodiment of the invention.

Typically, base stations are used for cellular telephone systems and like-type systems, while access points are used for in-home or in-building wireless networks. Regardless of the particular type of communication system, each wireless communication device includes a built-in radio transceiver and/or is coupled to a radio transceiver. The radio transceiver includes a linear amplifier and/or programmable multi-stage amplifier, as disclosed herein, to enhance performance, reduce costs, reduce size, and/or enhance broadband applications. In one embodiment, access point 16 supports communications using a multicast communication protocol according to at least one embodiment of the present invention. In an alternative embodiment, access point 16 is configured to communicate using both an IEEE 802.11 WLAN communication protocol and a multicast communication protocol. Here, at least one 802.11 channel is reserved for the multicast protocol communications and to carry a plurality of relatively smaller bandwidth communication channels.

Figure 2:
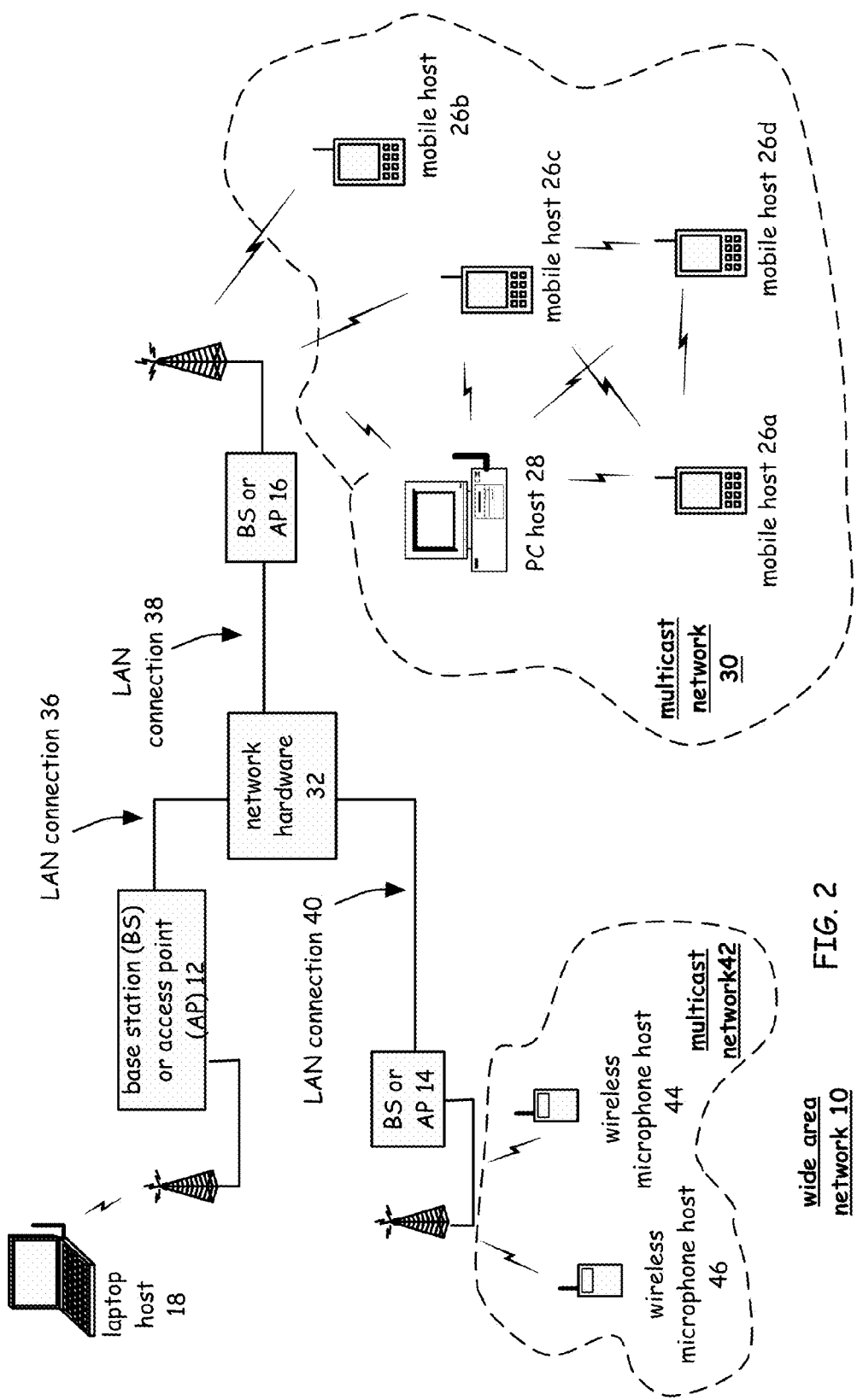
FIG. 2 is a functional diagram of wide area network that includes a wireless packet data broadcast network according to one embodiment that further includes a multicast network.

FIG. 2 is a functional diagram of wide area network that includes a wireless packet data broadcast network according to one embodiment that further includes a multicast network. FIG. 2 is similar to FIG. 1 in many ways but also includes multicast network 42. Multicast network 42 includes a plurality of wireless microphone hosts, represented here as wireless microphone hosts 44 and 46, that upload voice sources using a multicast communication protocol to a network for subsequent distribution to end users. Multicast network 42 may include mobile hosts 26a-d as well though they are not shown here. Wireless hosts 44-46 may be any type of wireless communication device include cell phones, dedicated transmit devices such as wireless microphones, etc.

Multicast networks 30 and 42 may readily communicate with external devices of a wide area network to exchange data and/or control information. For example, a user of laptop host 18 may control what voice sources produced by the wireless microphone hosts 44 and 46 are produced to the various hosts of multicast network 30. It should be understood that many sources of voice and data may be selected for broadcast transmission in multicast networks 30.

Figure 3:
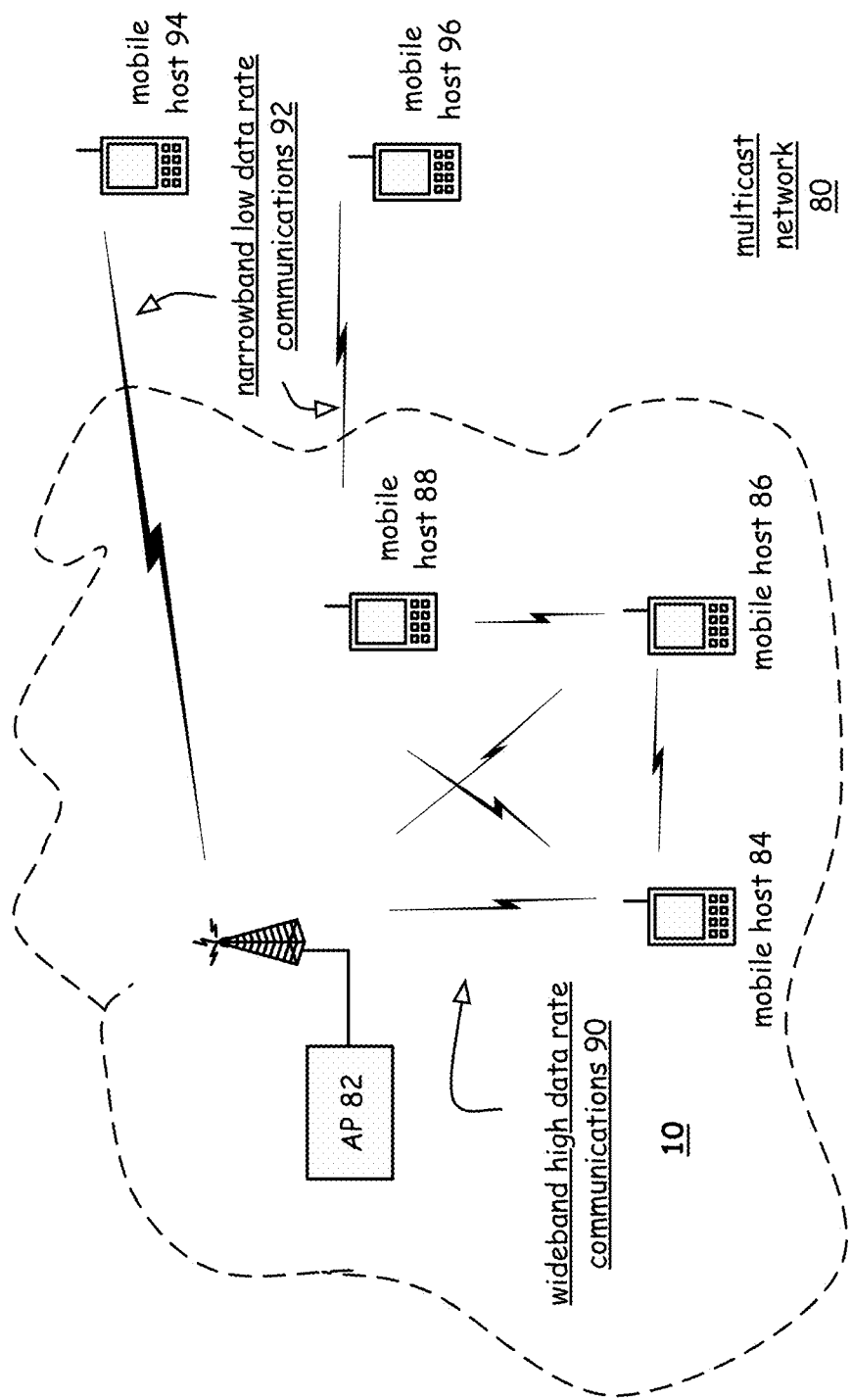
FIG. 3 is a functional diagram of a multicast network according to one embodiment that includes both short distance wideband high data rate communications and narrowband low data rate communications.

FIG. 3 is a functional diagram of a multicast network according to one embodiment that includes both short distance wideband high data rate communications and narrowband low data rate communications. FIG. 3 includes a multicast network 80 that further includes an access point 82 that communicates with a plurality of mobile hosts 84-88 in wideband high data rate communications 90 and in narrowband low data rate communications 92 with mobile hosts 94-96. As may further be seen, host 88, as with the other hosts 84-86, is operably configured to also engage in narrowband low data rate communications 92 with mobile hosts 94-96.

One aspect of the embodiment of the invention illustrated in FIG. 3 is that the narrowband and wideband communications are according to a multicast communication protocol. Thus, as will be explained in greater detail below, the narrowband and wideband high data rate communications are time synchronized to reduce interference. Alternatively, they are time and frequency synchronized in a network that utilizes frequency hopping. Furthermore, the mobile hosts are operably configured to not only communicate with access point 82, but also directly with each other whether it's via high data rate wideband communications (e.g., 2.4 GHz frequency communications) or via low data rate narrowband communications (e.g., 700 MHz or 900 MHz frequency band communications).

Figure 4:
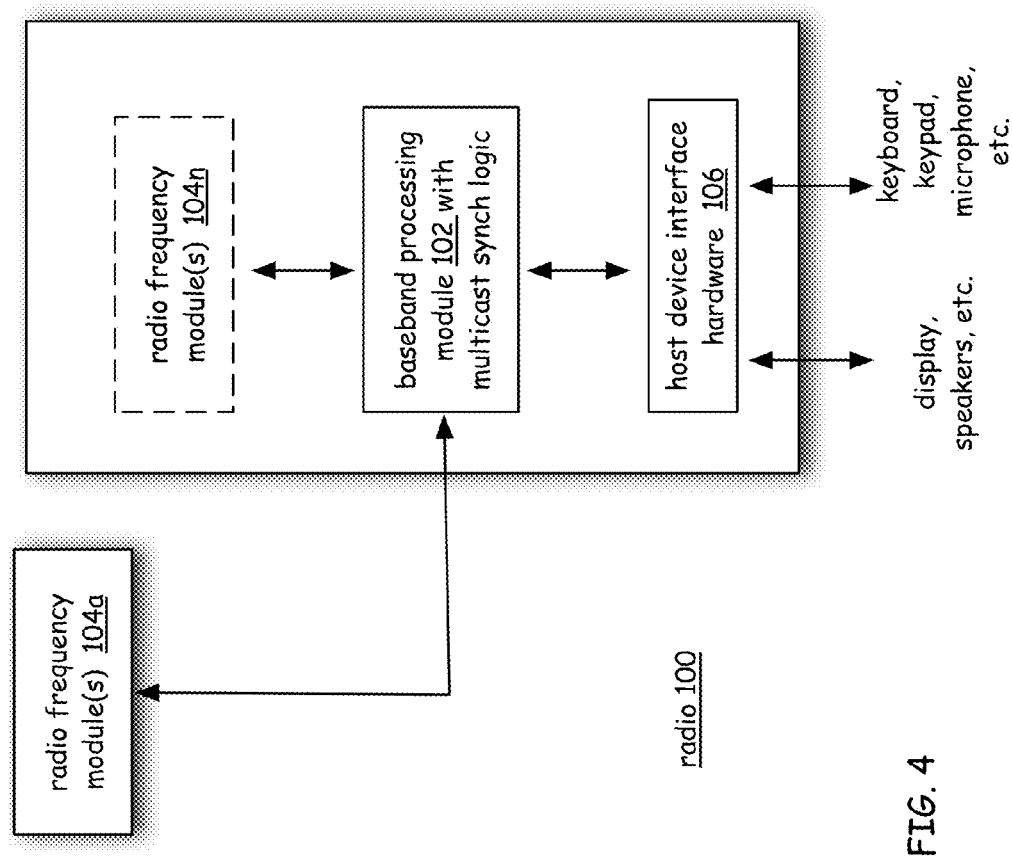
FIG. 4 is a functional block diagram of a transceiver according to one embodiment of the invention.

FIG. 4 is a functional block diagram of a wireless transceiver according to one embodiment of the invention. As may be seen a radio 100 (or wireless transceiver 100) includes baseband-processing module 102. Baseband processing module 102 includes multicast communication logic. Radio 100 further includes one or more radio frequency modules 104a-n. As is shown, radio frequency module 104a is operably disposed as a separate circuit or device in relation to baseband processing module 102. Optionally, and in one embodiment of the invention, at least one radio frequency module 104n is formed within the same integrated circuitry or application specific integrated circuitry (ASIC) or field programmable gate array (FPGA) circuitry as baseband processing module 102. Finally, operably disposed in the same circuitry as baseband-processing module 102 is host device interface hardware and circuitry 106 that interfaces with displays, speakers, keyboards, keypads, microphones, etc.

Figure 5:
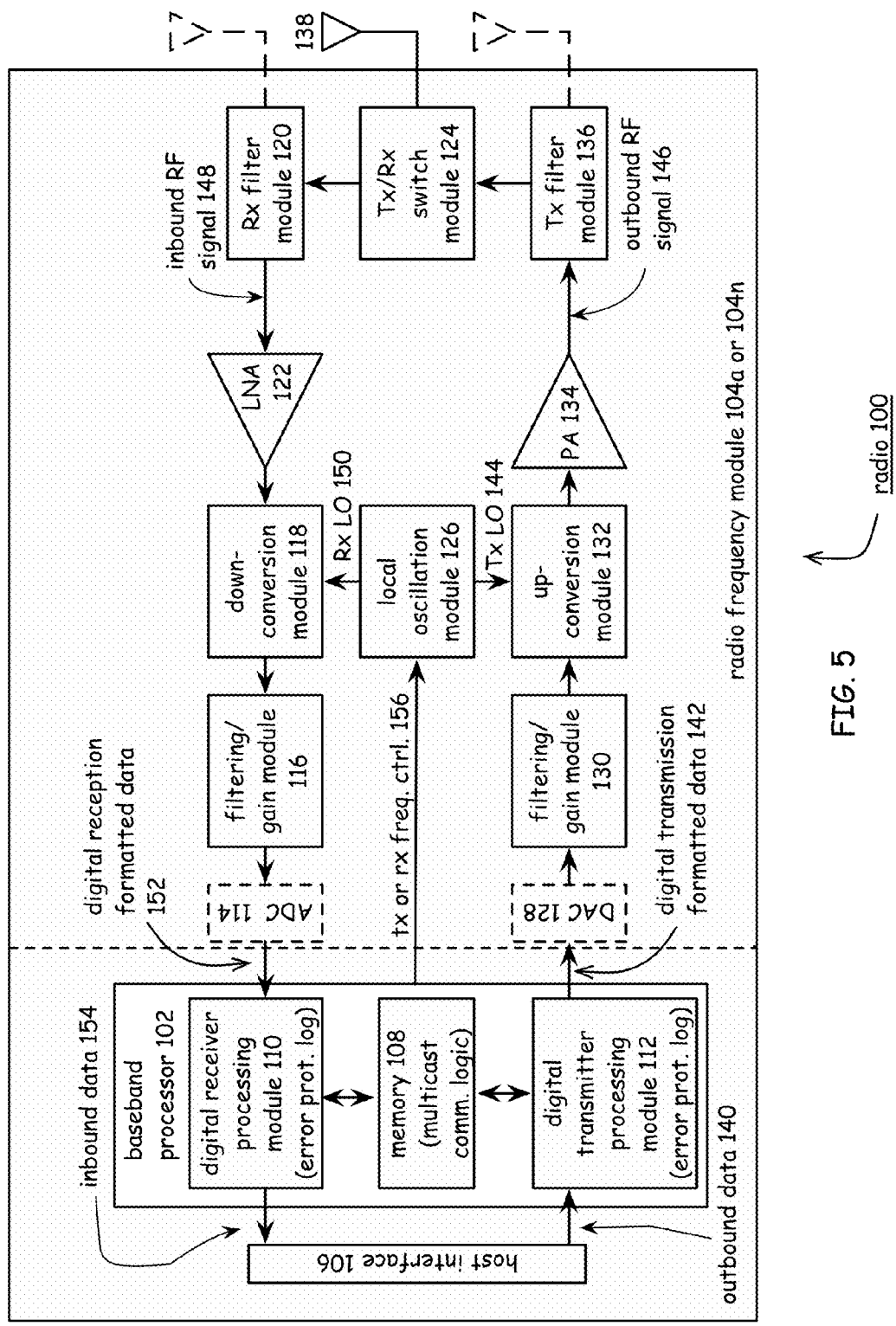
FIG. 5 is a functional block diagram of a radio according to one embodiment of the invention.

FIG. 5 is a functional block diagram of a radio according to one embodiment of the invention. FIG. 5 illustrates a wireless communication device or radio 100 that includes baseband processor 102, host interface 106 that interfaces host device hardware and a memory 108. Memory 108 includes computer instructions that define operation of the radio 100 including logic for multicast communication logic according to the various embodiments of the invention. For cellular telephone hosts, the radio frequency module is a built-in component such as 104n of FIG. 4. For personal digital assistants hosts, laptop hosts, and/or personal computer hosts, the radio frequency module may be built-in such as 104n or an externally coupled component such as 104a as shown in FIG. 4. Alternatively, a host device may include any plurality of radio frequency modules wherein one or more may be internal and one or more may be external.

As illustrated here in FIG. 5, the host device includes processor module 102 that further includes a digital receiver processing module 110 and a digital transmitter processing module 112. The processor module 102 and memory 108 execute the corresponding instructions that are typically done by the host device. For example, for a cellular telephone host device, the processor module 102 performs the corresponding communication functions in accordance with a particular cellular telephone standard or in the case of a multicast protocol access device, the functions of such an access device or both. As may further be seen, both the receiver processing module 110 and the digital transmitter processing module 112 both include error protection logic according to one embodiment of the invention. The error protection logic is, in the described embodiment, defined in the logic of the circuitry (hardware) that may be implemented in any aforementioned type of logic including FPGA, ASIC, etc. The logic may also be defined within memory of the modules 110 and 112. Generally, the transmitter-processing module 112 includes the logic to perform the error correction coding according to the embodiments of the invention while the receiver-processing module 110 includes corresponding logic to decode a received signal that was coded with logic similar to that in transmitter processing module 112.

The radio interface 106 allows data to be received from and sent to the radio 100. For data received from the radio 100 (e.g., inbound data 154), the radio interface 106 provides the data to the processor module 102 for further processing and/or routing to the interface 106. The interface 106 provides connectivity to an output display device, such as a display, monitor, speakers, etc., such that the received data may be displayed. The processor module 102 may receive the outbound data from an input device such as a keyboard, keypad, microphone, etc., via the input interface 108 or generate the data itself. For data received via the interface 106, the processor module 102 may perform a corresponding host function on the data and/or route it to the radio 100 via the radio interface 106.

Radio 100 includes an optional analog-to-digital converter (ADC) 114, a filtering/gain module 116, an IF mixing down-conversion module 118, a receiver filter module 120, a low noise amplifier 122, a transmitter/receiver switch module 124, a local oscillation module 126, an optional digital-to-analog converter (DAC) 128, a filtering/gain module 130, an IF mixing up-conversion module 132, a power amplifier 134, a transmitter filter module 136, and an antenna 138. Here, ADC 114 and DAC 128 are shown in dashed lines to represent their presence is optional. In an embodiment in which digital signals are modulated and transmitted or demodulated and received, the ADC and DAC are not needed and thus are shown here as optional.

The antenna 138 may be a single antenna that is shared by the transmit and receive paths as regulated by the TX/Rx switch module 124, or may include separate antennas for the transmit path and receive path. The antenna implementation will depend on the particular standard to which the wireless communication device is compliant.

The digital receiver processing module 110 and the digital transmitter-processing module 112, in combination with operational instructions stored in memory 106, execute digital receiver functions and digital transmitter functions, respectively. The digital receiver functions include, but are not limited to, digital IF to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 102 and 112, respectively, may be implemented using a shared processing device, individual processing devices, or a plurality of processing devices.

Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 106 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 110 and/or 112 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 100 receives outbound data 140 from the host device via the host interface 106. The host interface 106 routes the outbound data 140 to the digital transmitter processing module 112, which processes the outbound data 140 in accordance with a particular wireless communication standard (e.g., IEEE 802.11a, IEEE 802.11b, Bluetooth, etc.) or the multicast communication protocol described herein this disclosure to produce digital transmission formatted data 142. In the described embodiment, a synchronized multicast communication protocol is utilized to produce digital transmission formatted data 142. The digital transmission formatted data 142 will be a digital baseband signal or a digital low IF signal, where the low IF typically will be in the frequency range of one hundred kilohertz to a few megahertz.

The digital-to-analog converter 128 converts the digital transmission formatted data 96 from the digital domain to the analog domain in embodiments in which a digital output signal is not to be modulated and transmitted. The filtering/gain module 130 filters and/or adjusts the gain of the analog signal prior to providing it to the mixing stage 132. The mixing up-conversion module 132 directly up converts the analog baseband or low IF signal into an RF signal based on a transmitter local oscillation 144 provided by local oscillation module 126, which may be implemented in accordance with the teachings of the present invention. The power amplifier 134 amplifies the RF signal to produce outbound RF signal 146, which is filtered by the transmitter filter module 136. The antenna 138 transmits the outbound RF signal 146 to a targeted device such as a base station, an access point and/or another wireless communication device.

The radio 100 also receives an inbound RF signal 148 via the antenna 138, which was transmitted by a base station, an access point, or another wireless communication device. The antenna 138 provides the inbound RF signal 148 to the receiver filter module 120 via the TX/Rx switch module 124, where the Rx filter module 120 band pass filters the inbound RF signal 148. The Rx filter module 120 provides the filtered RF signal to low noise amplifier 122, which amplifies the inbound RF signal 148 to produce an amplified inbound RF signal.

The low noise amplifier 122 provides the amplified inbound RF signal to the IF mixing down-conversion module 118, which directly converts the amplified inbound RF signal into an inbound low IF signal or baseband signal based on a receiver local oscillation 150 provided by local oscillation module 126, which may be implemented in accordance with the teachings of the present invention. The mixing down-conversion module 118 provides the inbound low IF signal or baseband signal to the filtering/gain module 116. The filtering/gain module 116 filters and/or gains the inbound low IF signal or the inbound baseband signal to produce a filtered inbound signal. As may also be seen, baseband processor 102 is operably configured to produce a TX/Rx frequency control signal to support frequency hopping according to one aspect of the embodiments of the present invention.

The optional analog-to-digital converter 114 converts the filtered inbound signal from the analog domain to the digital domain to produce digital reception formatted data 152 in embodiments in which digitally modulated data signals are not being received. The digital receiver processing module 110 decodes, descrambles, demaps, and/or demodulates the digital reception formatted data 152 to recapture inbound data 154 in accordance with the particular wireless communication standard being implemented by radio 100. The host interface 108 provides the recaptured inbound data to the host device. As one of average skill in the art will appreciate, the wireless communication device of FIG. 9 may be implemented using one or more integrated circuits.

Figure 6:
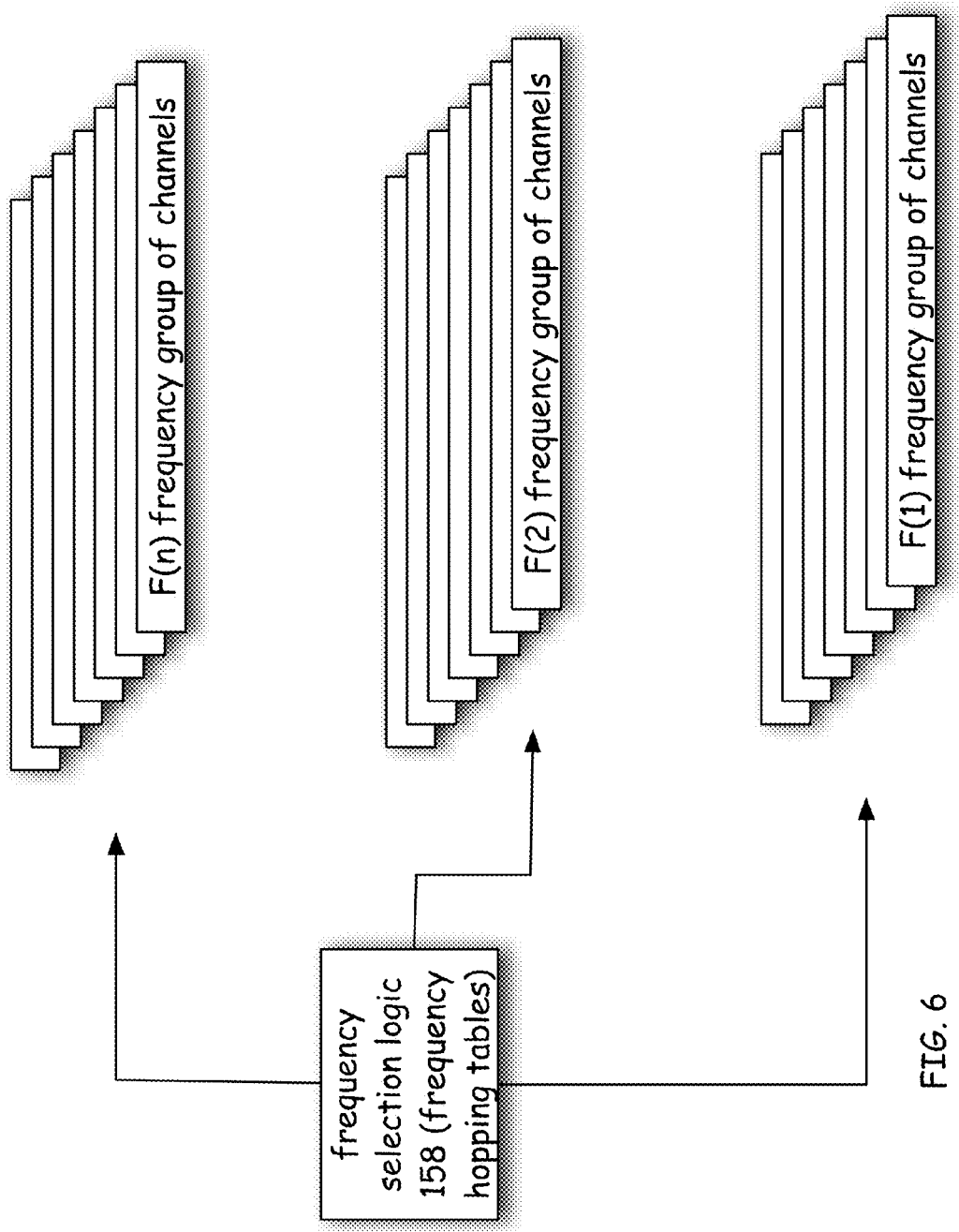
FIG. 6 is a functional diagram illustrating one aspect of the embodiments of the present invention relating to frequency selection logic.

FIG. 6 is a functional diagram illustrating one aspect of the embodiments of the present invention relating to frequency selection logic. As may be seen in relation to FIG. 6, a radio transceiver according to one embodiment of the present invention may include frequency selection logic 158 in the form of frequency hopping tables that specify what frequency channel (specific carrier frequency) is to be used out of a plurality of frequency channels for at least a portion of a transmission. As illustrated in FIG. 6, in one embodiment, the frequency hopping tables and logic include frequencies from three frequency bands. In one embodiment, those three frequency bands include 3 of 5.8 GHz, 2.4 GHz, 900 MHz and approximately 700 MHz (television white space).

Figure 7:
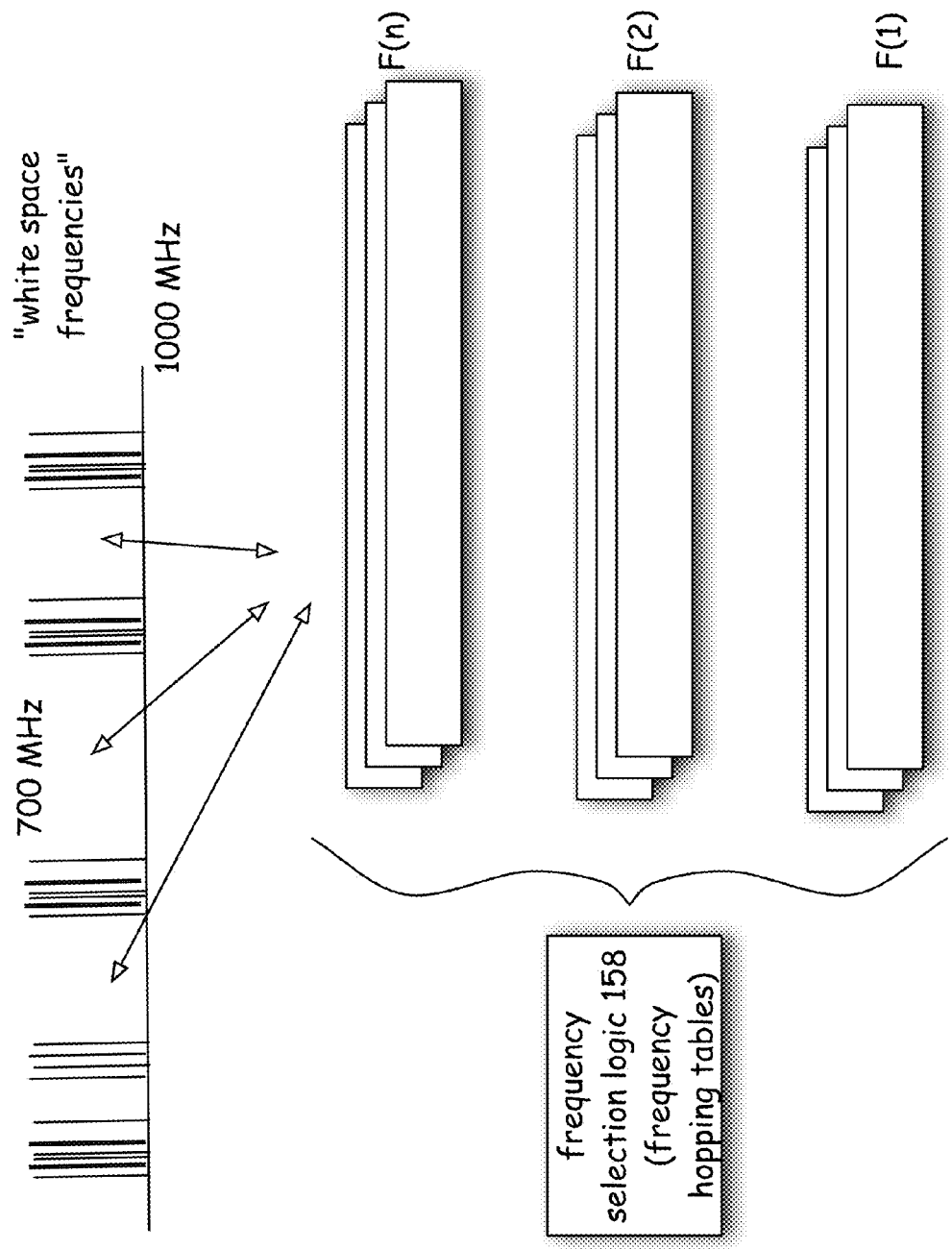
FIG. 7 is a functional diagram illustrating an additional aspect of the embodiments of the present invention relating to frequency selection logic.

FIG. 7 is a functional diagram illustrating an additional aspect of the embodiments of the present invention relating to frequency selection logic. In the embodiment of FIG. 7, one of the three frequency bands is the 700 MHz white space frequencies. The "white space" frequencies are those unused frequencies that have historically been allocated for television broadcast transmissions.

Figure 8:
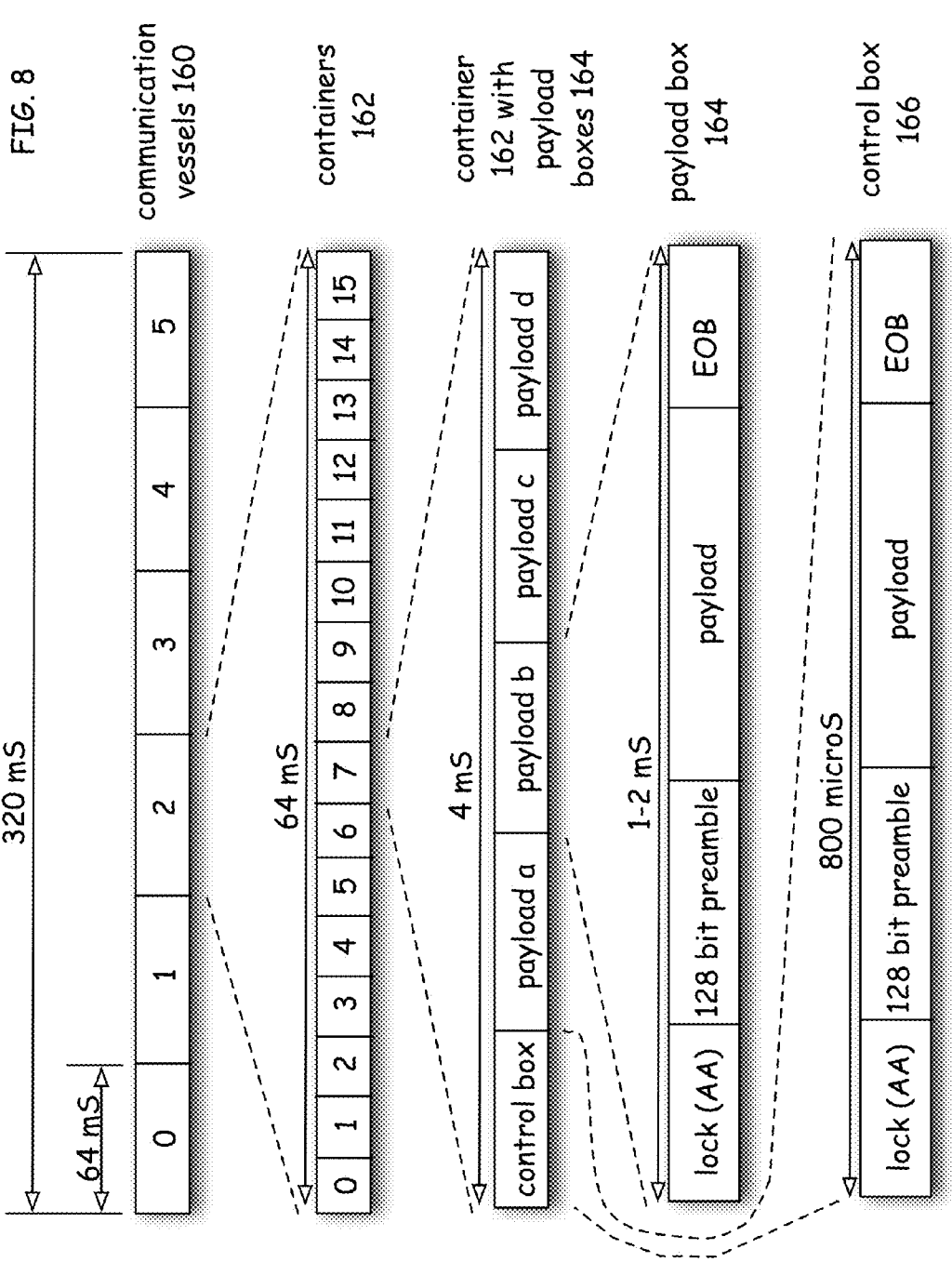
FIG. 8 is a functional diagram illustrating one aspect of the multicast communication protocol and the use of communication structures according to one embodiment of the invention.

FIG. 8 is a functional diagram illustrating one aspect of the multicast communication protocol and the use of communication structures according to one embodiment of the invention. In one embodiment of the invention, the multicast protocol defines a plurality of communication vessels 160 that includes a plurality of containers 162. In the described embodiment, one frame includes six vessels 160. Each vessel 160 includes a plurality of containers 162.

In the described embodiment, one vessel 160 includes sixteen containers 162. For wideband communications, each container 162 includes a control box 166 and a plurality of payload boxes 164. In the described embodiment, a container 162 includes four payload boxes 164 designated as a-d. Each payload box a-d includes a lock period, a 128-bit preamble, a payload, and an end of box (EOB) indication. Each control box 166 has a similar structure. Each control box includes a lock period, a 128-bit preamble, a payload and an EOB indication. For narrowband communications, an entire payload is used as a control box.

Figure 9:
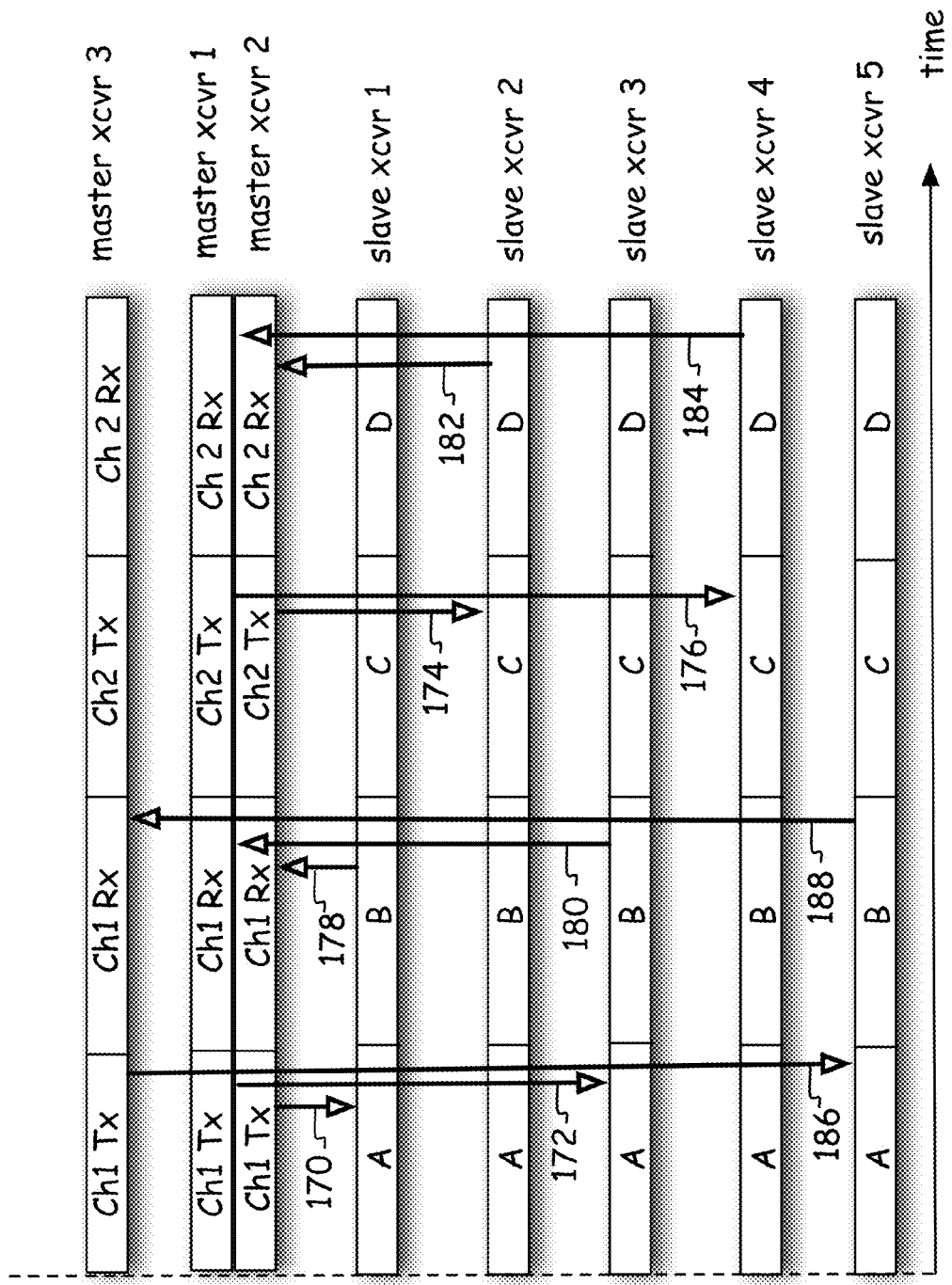
FIG. 9 is a functional diagram that illustrates synchronized communications based upon the use of the multicast communication protocols according to one embodiment of the invention.

FIG. 9 is a functional diagram that illustrates synchronized communications based upon the use of the multicast communication protocols according to one embodiment of the invention. One aspect of the present embodiments of the invention is that transmissions are highly synchronized using the vessel/container structures described in relation to FIG. 8. For example, for two stacked master transceivers 1 and 2, transmissions to four slave transceivers 1-4 are as follows.

Within the same container, master transceivers 1-2 transmit communication signals 170 and 172 during container A to slave transceivers 1 and 3, respectively. Master transceivers 1-2 transmit communication signals 174 and 176 to slave transceivers 2 and 4 during container C. Slave transceivers 1 and 3 respond with communication signals 178 and 180 during container B and slave transceivers 2 and 4 respond with communication signals 182 and 184 during container D.

Similarly, if there is a third master transceiver 3 that is proximate to master transceivers 1-2, that wishes to communicate with a slave transceiver 5, transceiver 3 will transmit communication signal 186 to slave transceiver 5 during container A (or container C) and will receive communication signal 188 as a reply from slave transceiver 5 during container B (or container D). One aspect of what is shown in FIG. 9 is that outgoing transmissions occur during common periods and ingoing transmissions are received during common periods. The vessel/container structure illustrated is utilized to synchronize outgoing and ingoing communications between various transmitters and receivers to reduce noise/interference. Another aspect that should be noted is that containers can carry outgoing as well as ingoing signals.

Figure 10:
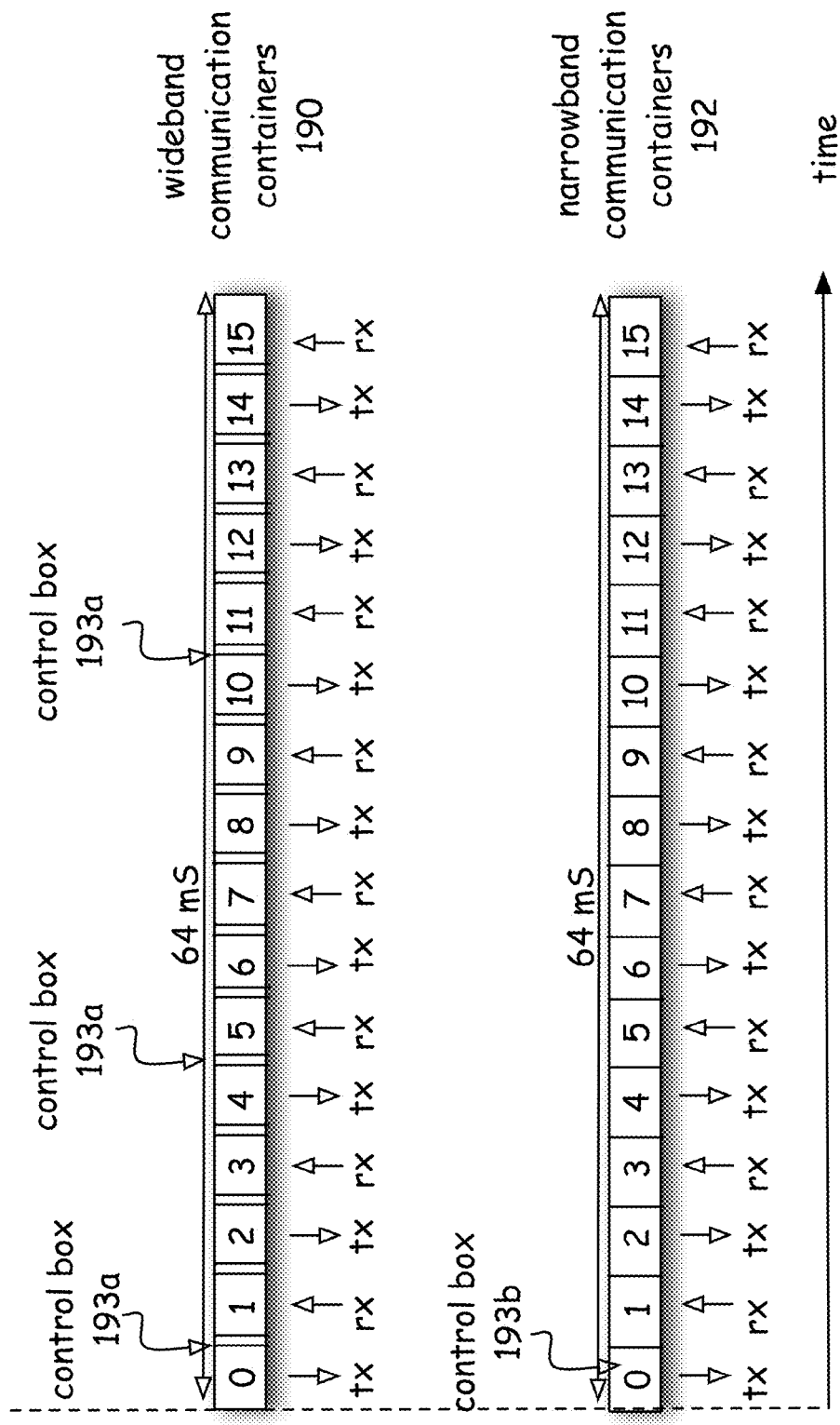
FIG. 10 is a functional diagram that illustrates synchronized communications for narrowband and wideband communications according to one embodiment of the invention.

FIG. 10 is a functional diagram that illustrates synchronized communications for narrowband and wideband communications according to one embodiment of the invention. One key aspect to note about FIG. 10 is that the containers for wideband and narrowband communications are sized the same and are synchronized in time and direction (as with the wideband containers of FIG. 8). Thus, narrowband and wideband communications are timed to not interfere with each other with the so-called Near-Far problem that is well known in the art.

As may be seen, wideband communication containers 190 are sized similarly to narrowband communication containers 192 and are synchronized in time and transmission direction (outgoing and ingoing). Furthermore, each wideband container 190 includes a control box 193a. Control box 193a is for carrying control signals such as destination addresses, transmission data rate, transmission frequency, an indication of transmit or receive, etc. Because data rates and frequencies can change from container to container, a control box is disposed between each container to provide a settle time in addition to the described control signaling.

Because of the nature of the narrowband communication, namely, relatively low data rates, an entire container is used as a control box. Thus, as shown, a control box 193b is shown occupying time slot 0 of narrowband communications 192. In the described embodiment, the sixteen containers 0-15 are 64 mS long in one embodiment of the invention. In one embodiment, the control boxes are generated using code division multiple access (CDMA) communications to avoid collisions because they could be transmitted by multiple devices as the same time seeking access.

Figure 11:
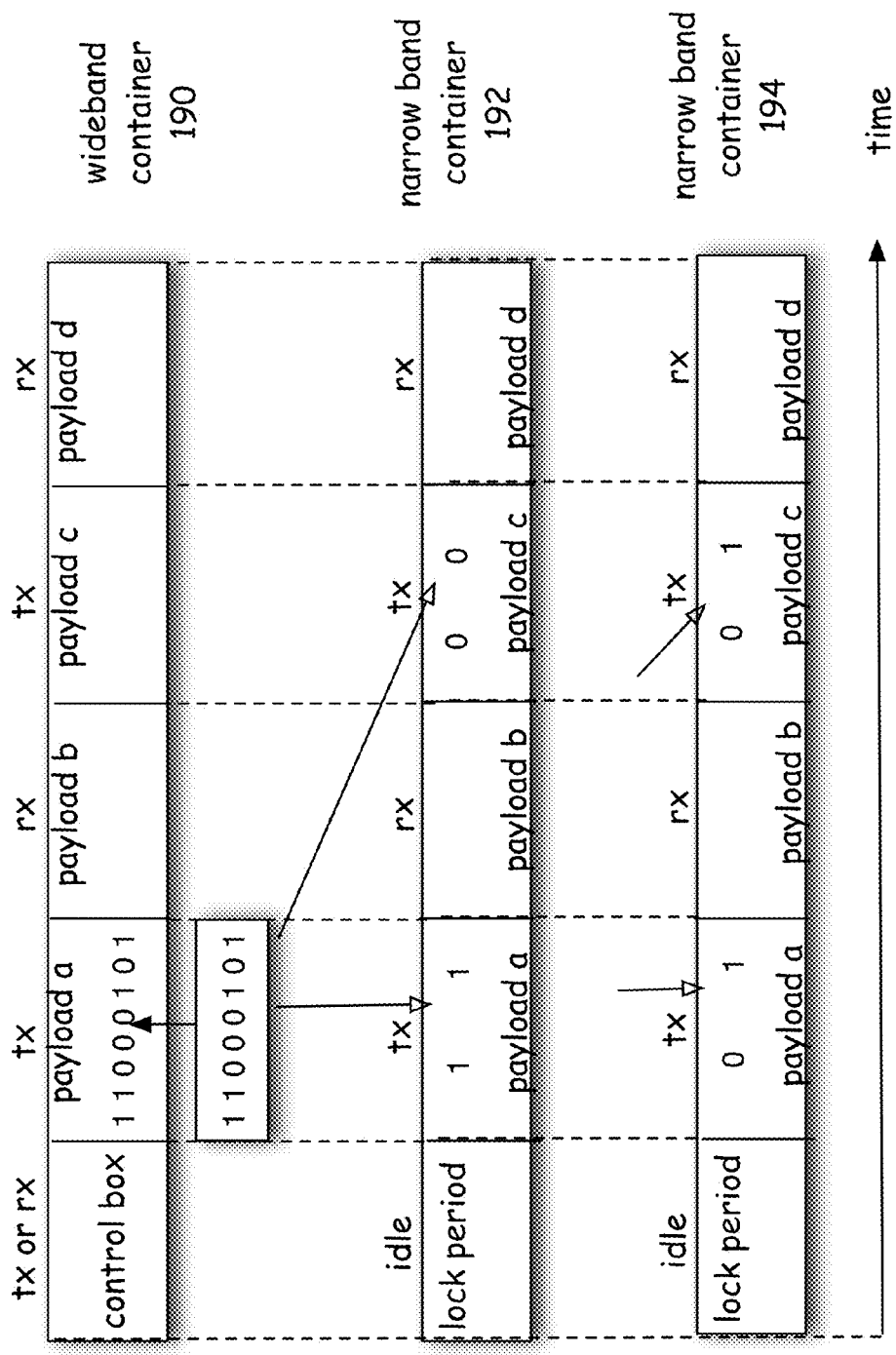
FIG. 11 is a functional diagram that illustrates data carrying in wideband and narrowband communications using multicast communication protocols according to one embodiment of the invention.

FIG. 11 is a functional diagram that illustrates data carrying in wideband and narrowband communications using multicast communication protocols according to one embodiment of the invention. As shown in FIG. 8, an exemplary container size is 4 mS in duration. As such, a wideband container can carry, for example, 3200 bits within the payload section. A 3200-bit block of data that can be transmitted via wideband communications, however, must be spread out over a plurality of narrowband containers. In one application, each narrowband container can carry approximately 64 bits of data thereby requiring 50 narrowband containers to carry the same amount of data in one wideband container. This assumes a 20 kilobits per second (kpbs) narrowband transmission rate. In some narrowband embodiments, the narrowband transmission rate is 10 kpbs meaning that a container can only carry 32 bits of payload.

As may also be seen, the narrowband container 192 and 194 include a lock period that is aligned in time with the control box of wideband container 190. Because the containers are commonly sized and synchronized, however, both wideband and narrowband transmissions and receptions occur synchronously thereby eliminating interference between the ingoing and outgoing transmissions regardless of whether they are narrowband or wideband. FIG. 11 illustrates this aspect of the inventive embodiments.

Additionally, because payload sections alternate between "TX" and "RX", and because the data shown cannot all be transmitted during one narrowband container payload, it may be necessary, as shown, to distribute all of the data that fits in one wideband container payload box into a plurality of narrow band containers and associated payload boxes. As may be seen, the outgoing data is only inserted in to "TX" payload boxes. The example shows eight bits for simplicity being distributed among the multiple narrowband containers. It should be understood that each narrowband container carries substantially more data that a few bits as shown.

Figure 12:
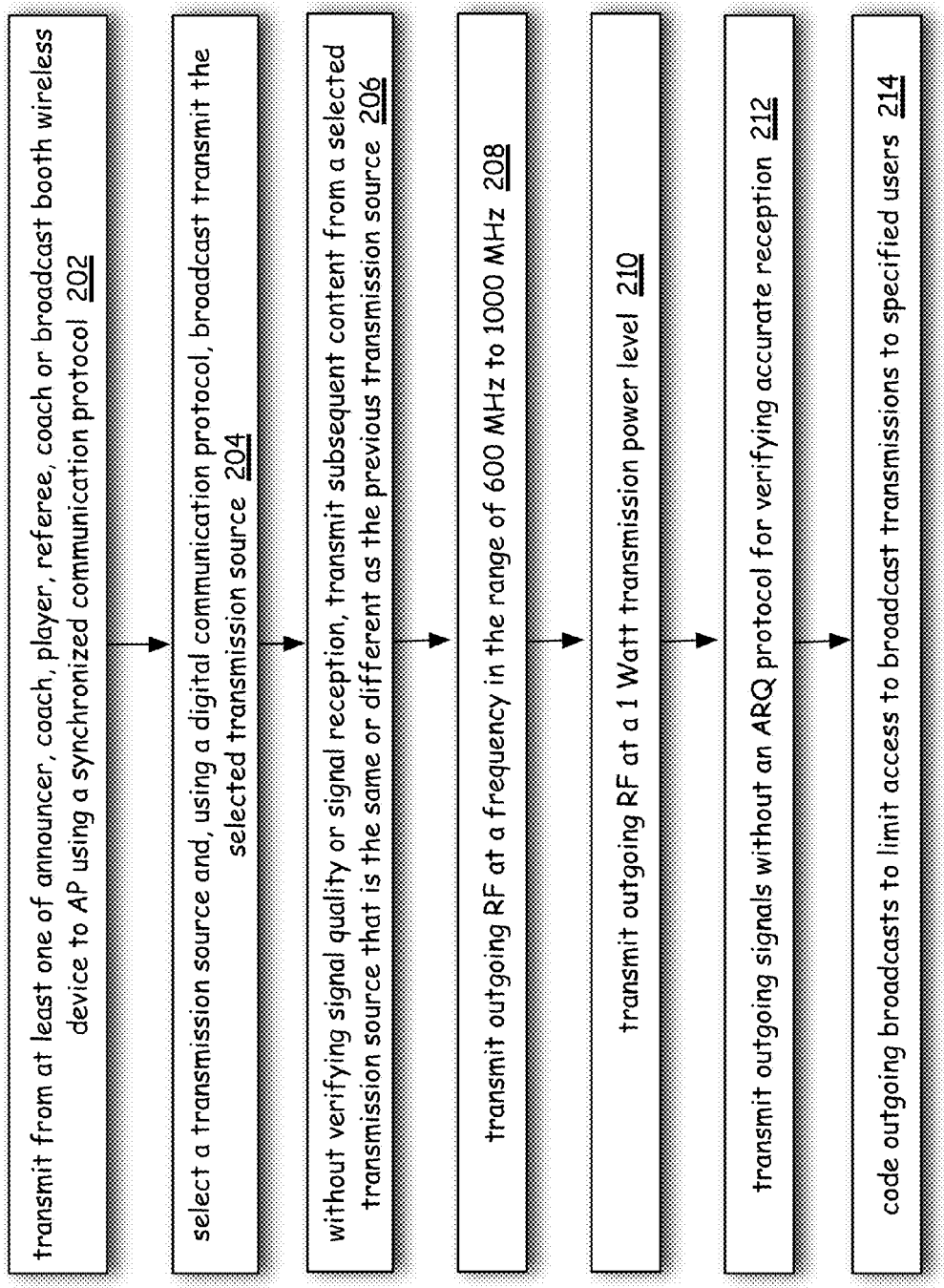
FIGS. 12 and 13 are flow charts that illustrate various method steps for various embodiments of the invention.
Figure 13:
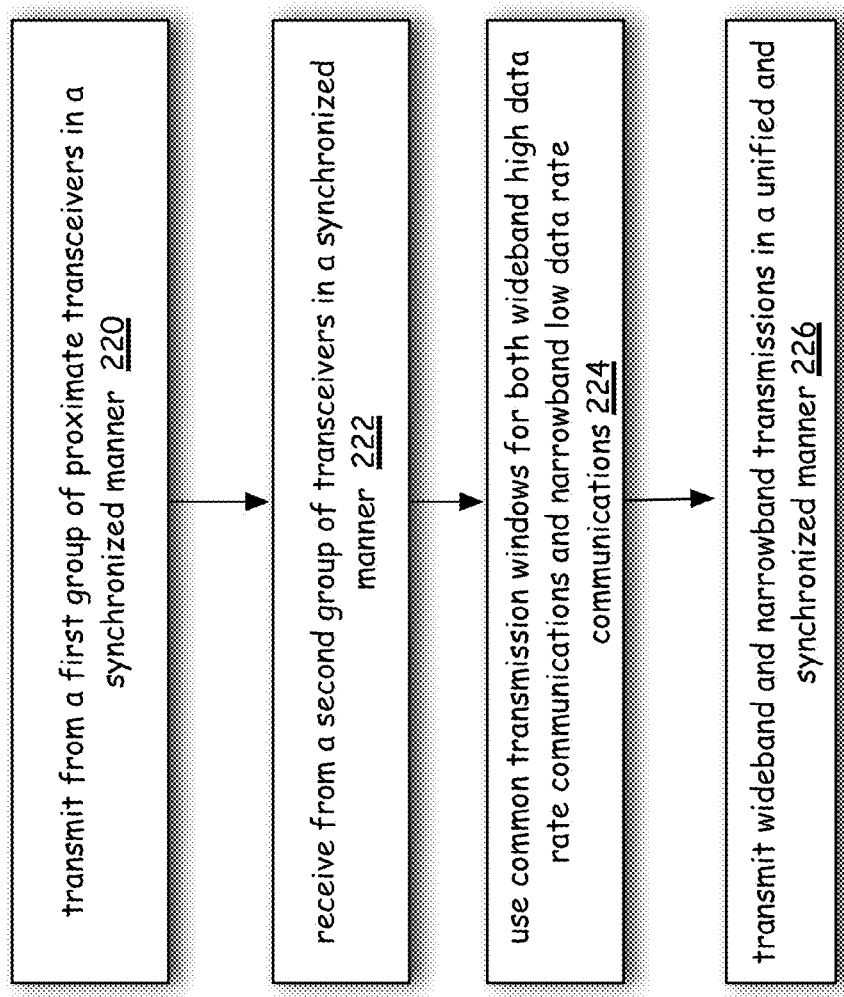

FIGS. 12 and 13 are flow charts that illustrate various method steps for various embodiments of the invention. In FIG. 12, the method includes transmit from at least one of announcer, coach, player, referee, coach or broadcast booth wireless device to AP using a synchronized communication protocol in step 202. Thereafter, the method includes selecting at least one transmission source and, using a digital communication protocol, broadcast transmit the selected transmission source(s) in step 204. The method specifically includes, without verifying signal quality or signal reception, transmitting subsequent content from a selected transmission source that is the same or different as the previous transmission source in step 206. This step essentially means that the digital broadcast transmissions are without any error checking or correction through use of ARQ type schemes as shown in step 212. In one embodiment, the method comprises transmitting outgoing radio frequency (RF) signals at a frequency in the range of 600 MHz to 1000 MHz in step 208 at a 1 Watt transmission power level as shown in step 210. code outgoing broadcasts to limit access to broadcast transmissions to specified users in step 214. The transmissions in FIG. 12 are according to the multicast communication protocols.

In FIG. 13, the illustrated method includes transmit from a first group of proximate transceivers in a synchronized manner in step 220 and receiving from a second group of transceivers in a synchronized manner in step 222. The method further includes using common transmission windows for both wideband high data rate communications and narrowband low data rate communications in step 224. Finally, one aspect of the invention includes transmitting wideband and narrowband transmissions in a unified and synchronized manner in step 226.

Figure 14:
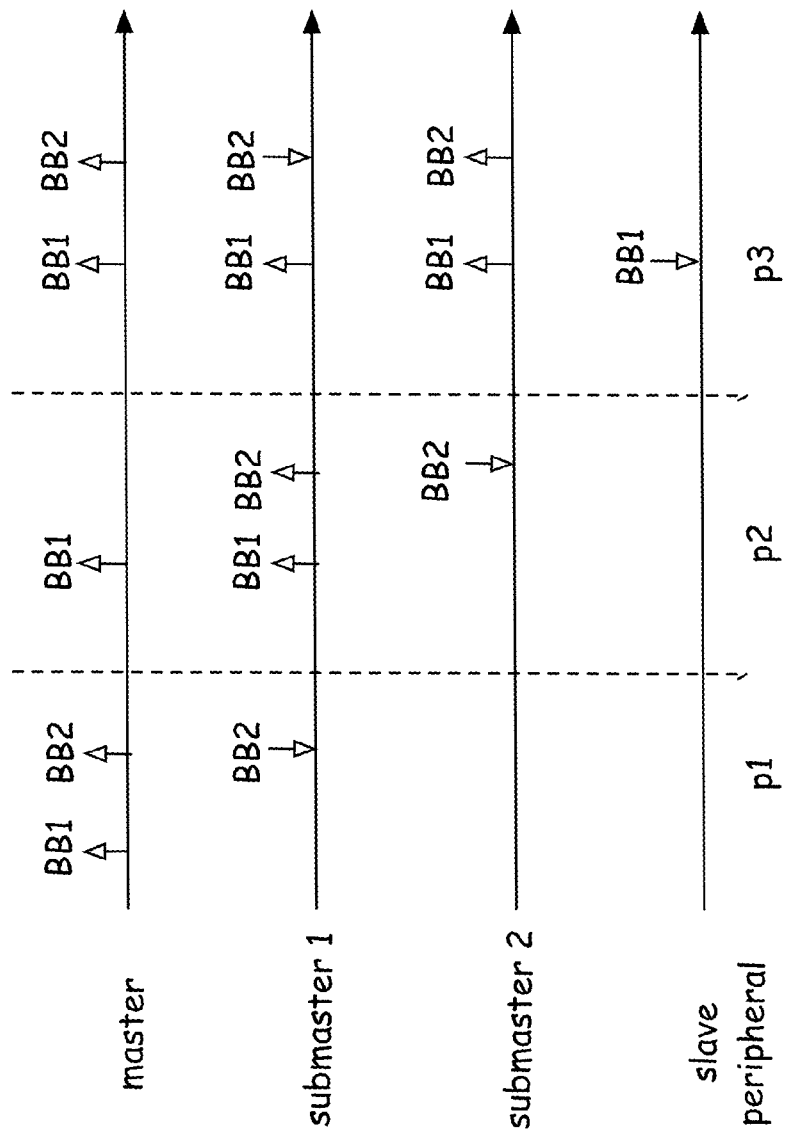
FIG. 14 illustrates one aspect of the invention in which transmissions are time synchronized according to one embodiment of the invention.

FIG. 14 illustrates a method for synchronizing a plurality of devices according to one embodiment of the invention. In a first time period p1, a network master generates a synchronization signal BB1 and a relay signal BB2. BB1 is a timing signal for all slave devices that are served by the network master (including sub masters). All transmissions and receptions by the slave devices are in relation to the BB1 signal timing. BB2 is a relay signal that is received by sub masters and passed on to other sub masters. According to the protocol of the embodiments of the invention, a device that is a slave to a master, e.g., sub master 1 is a slave device to the master but is a master to sub master 2, may act as a master to other slave devices and sub masters.

When sub master 1 receives relay signal BB2 from the master, sub master 1 is configured to set its internal clock(s) and to subsequently generate its own BB1 signal to its slaves at the same time that the master generates its BB1 signal. Moreover, sub master 1 is able to generate a BB2 signal in a synchronized manner with the Master device. This is demonstrated in time period p3. In time period p3, the master, sub master 1 and sub master 2 all generate BB1 beacon signals at the same time. Slave peripheral receives BB1 transmitted by sub master 2 at the same time. Accordingly, all four devices work on a synchronized clock. Generally, the above process continues between each master and sub master until a BB1 signal is being received by all slave devices that are not masters (i.e., are not sub masters) to any other slave devices. As such, all devices are synchronized and only communicate during designated transmission periods and receive during receive periods. This allows devices to reduce and/or eliminate the near-far interference problem.

Figure 15:
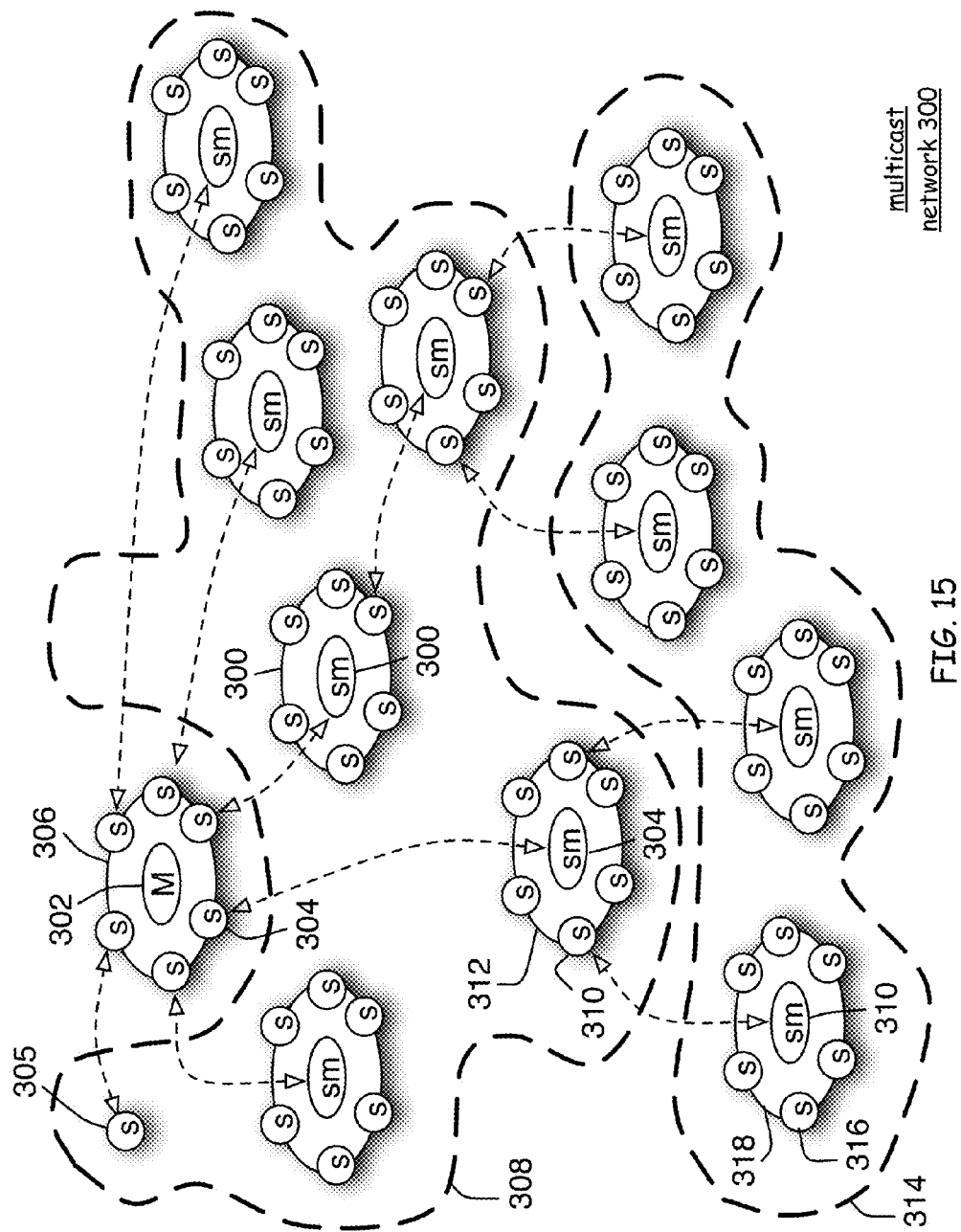
FIG. 15 is a functional block diagram of a wireless packet data network according to one embodiment of the invention.

FIG. 15 is a functional block diagram of a wireless packet data network according to one embodiment of the invention. Referring now to FIG. 15, a wireless communication device 302 is configured to operate as a super cell master. A first plurality of wireless communication devices 304 are configured to operate as slave devices in relation to communications with the super cell master 302 within cell 306. Second plurality 308 of wireless communication devices 310 that are operably disposed within second pluralities of cells 312 and configured to operate as slaves in relation to associated wireless communication devices of the first plurality of wireless communication devices. The first plurality of wireless communication devices are further configured to operate as masters for each of the associated second pluralities of wireless communication devices and cells. Each cell master (or sub master) of the cells 312 is a slave device to super cell master 302 in cell 306. A third plurality 314 of wireless communication devices 316 are operably disposed within third pluralities of cells 318 and configured to operate as slaves in relation to associated second pluralities of wireless communication devices 310. The second plurality of wireless communication devices 310 are further configured to operate as masters for each of the associated third pluralities of wireless communication devices 316 and cells 318.

To explain more simply, super cell master 302 is a master to each of the slave device is 304 within the cells 306. Each of the slave devices 304 is a master to each of the slave devices 310 within cells 312. Each of the slaves 310 either is configured to operate exclusively as a slave, or as a master to slaves 316 within cells 318. The slaves 316 of cells 318 then may operate either exclusively as cells or as masters to other cells.

In one embodiment, each of the slaves 316 comprises a sensor configured to communicate wirelessly with the associated masters 310. One aspect of the embodiment illustrated in FIG. 15, is that except for the super cell master, every device that operates as a master also operates as a slave in relation to a higher-level master. Thus, these masters may be referenced herein as sub-masters. One reason for this topology, is that it supports high levels of synchronization between the various devices to support synchronized transmissions and reception of transmissions by remote devices.

Previously, in relation to FIG. 14, a method for synchronizing communication devices with the use of synchronization beacons and relay beacons was discussed. Referring again to FIG. 15, the transmission of the synchronization and relay beacons occurs between the pluralities of communication devices arranged as shown in FIG. 15.

Each sub master of FIG. 15 receives the relay beacons from its master to determine the timing of the synchronization beacons that it produces to its slave devices. As sets, all slave, sub master and super cell master devices shown in FIG. 15 operate on a synchronized clock and synchronized transmission and reception windows. More specifically, these transmission and reception windows were shown before and described as vessels, containers, etc. Each of the sub master slave devices, therefore, receives relay beacon signals from its cell master and generates relay beacon signals to its associated slave devices that also are sub masters for their associated cells. Because all of the relay beacon signals are generated at the same time to the slave devices that are also sub Masters, each of these sub master slave devices is configured and operable to generate synchronization beacon signals that are synchronized with the synchronization beacon signals generated by the super cell master.

To reduce the possibility of signal collisions, each of these sub master slave devices generates the synchronization beacon signals at different frequencies in relation to each other and based on the prior received relay beacon signals. The synchronization relay signals, however, are transmitted at the same frequency between masters and slaves in a cell. One additional aspect that this circuit topology supports is that each slave device is only required to know who its master is. Accordingly, communication signals that are intended for devices that are external to its associated cell are merely transmitted to the master for additional forwarding.

Each master, or more accurately, sub master, will forward a received communication either to a slave device within its cell or to its own master. When a communication signal reaches the super cell master, then the super cell master will determine where to forward the communication. In the described embodiment, only the super cell master has an address table to track the locations of the slaves and sub masters within its super cell.

In one embodiment of the invention, the synchronization signals are transmitted every 16 milliseconds. In an alternative embodiment, since synchronization signals transmitted every four milliseconds. Another aspect of the embodiment of FIG. 15, is the each of the first, the second and the third pluralities of wireless communication devices each has a common group code within the associated pluralities and wherein all wireless can mutation devices associated with the super cell master have a common master code.

Figure 16:
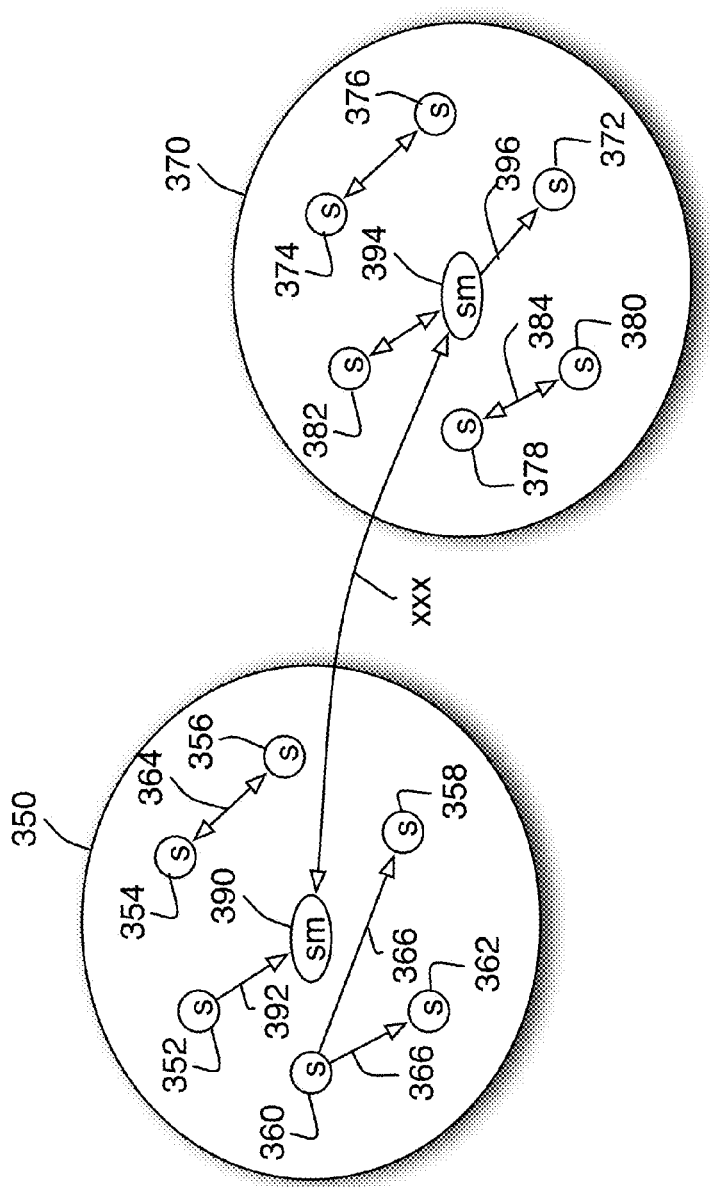
FIG. 16 is a functional block diagram illustrating one aspect of communications in a multicast protocol communication network according to one embodiment of the invention.

FIG. 16 is a functional block diagram illustrating one aspect of communications in a multicast protocol communication network according to one embodiment of the invention. Referring now to FIG. 16, a cell 350 has a plurality of slave devices 352-362. One aspect of the present invention, is that wireless communication devices may communicate with each other directly and do not need to utilize network resources to complete a communication link. Thus, as may be seen, wireless communication device 354 may communicate directly with wireless can mutation device 356 via communication link 364. Another aspect of the embodiments of the present invention, is that the wireless communication devices can also perform broadcast transmissions to a plurality of wireless communication devices. This is shown in FIG. 16. Wireless communication device 360 is generating a broadcast transmission 366 to wireless communication devices 358 and 362.

A cell 370 includes a plurality of slave devices 372-382. Cell 370 includes slaves that operate similarly to those of cell 350. As maybe seen, slave 374 is communicating directly with slave 376. Slave 378 is communicating directly with slave 380 via communication link 384.

As discussed previously, if a wireless communication device wishes to transmit a committee cases signal to a wireless communication device that is not within the same cell, the wireless communication device produces the communications signal with a destination address to its cell master. Thus, if slave 352 wishes to transmit a communication signal to slave 372 of cell 370, slave 352 forwards that communication signal to its sub master 390 via a wireless communication link 392. In one embodiment, such a communication is forwarded all the way up to the super cell master. The super cell master then uses an address table to determine where to forward the communications. Alternatively, a sub master 390 is configured to communicate with the cell super master to obtain an address and then to forward directly the sub master 394 for deliver to slave 372. Sub master 390, which is the master of cell 350, then forwards the communication to sub master 394, which is the master of cell 370. Sub master 394 then forwards the communication to slave 372 via communication link 396.

Figure 17:
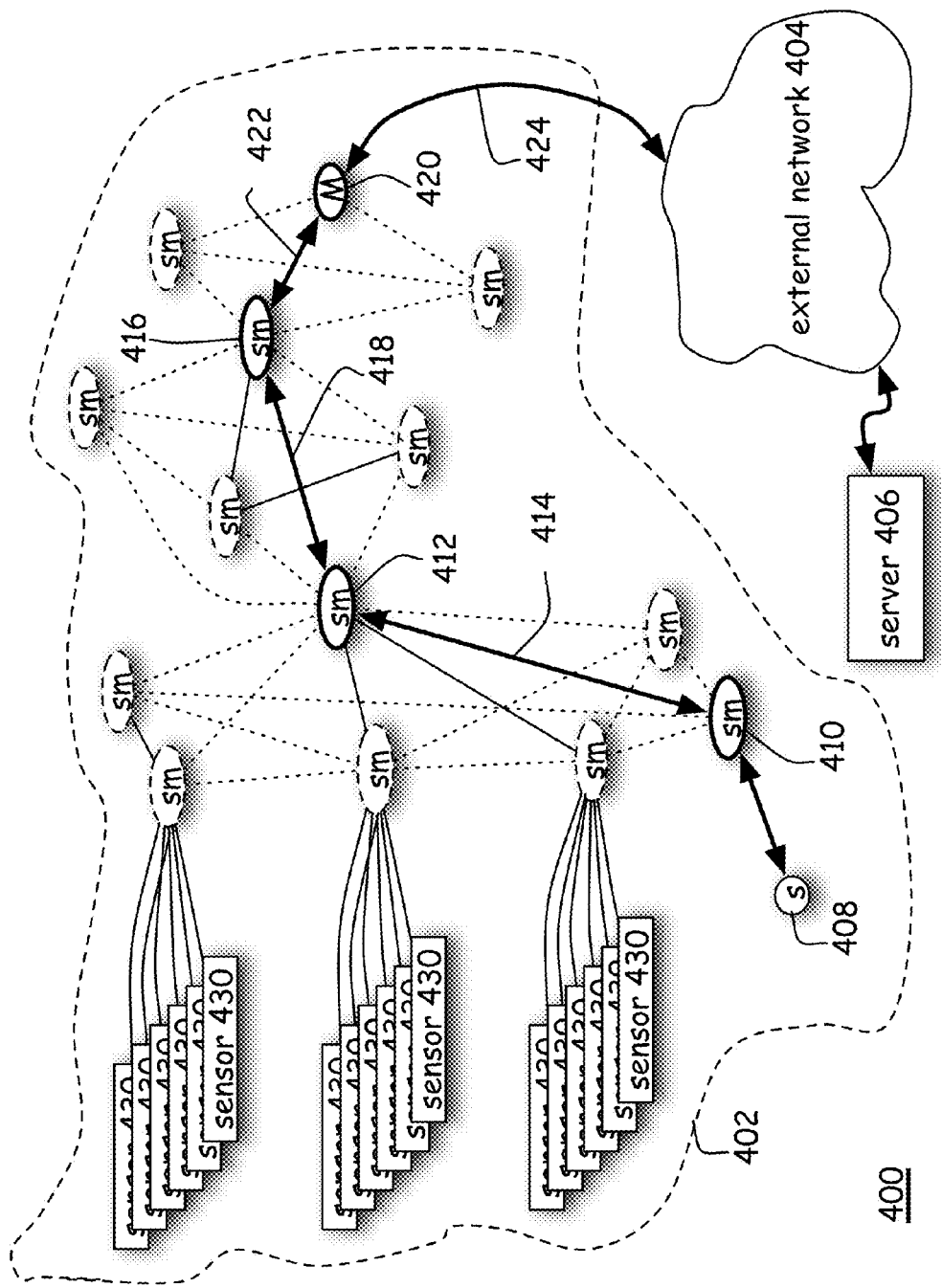
FIG. 17 is a functional block diagram that illustrates one aspect of the present invention.

FIG. 17 is a functional block diagram that illustrates one aspect of the present invention. Referring now to FIG. 17, a wide area network 400 includes a multicast network 402 that is communicatively coupled to an external network 404 that, in turn, is coupled to a server 406. Within multicast network 402, a slave 408 that wishes to transmit a communication signal to an external server 406 is not required to know how to route the mutations signal through multicast network 402 to access external network 404 to reach server 406. Slave 408 merely forwards the communications signal to its master, which is shown as sub master 310 with the destination address of server 406. Sub master 310, upon realizing that the communication signal is not for any of its own slave devices, forwards the communications signal to its master that is shown as sub master 412 via communication link 414. Sub master 412, upon realizing that the communications signal is not for any of its own slave devices/communication signal to sub master 416 via communication link 418. Similarly, sub master 416, upon realizing that the communication signal is not for it or any of its slave devices, forwards the communication signal to master 420 via communication link 422. Master 420, upon receiving the communication signal, is able to determine using an address table to route the communication signal via communication link 424 to an external network 404 and to server 406 that is operably coupled to external network 404. The address table is updated to keep location of the devices within super cell served by master 420.

To illustrate the operation in FIG. 17, the slave devices 430 comprise, in one embodiment of the present invention, a plurality of sensors 430. Each of the sensors 430 is associated with a sub master. Thus, in one example of the invention, the sensors 430 will periodically produce to communication signals that includes sensor data that is to be delivered to server 406 via the multicast network 402.

Figure 18:
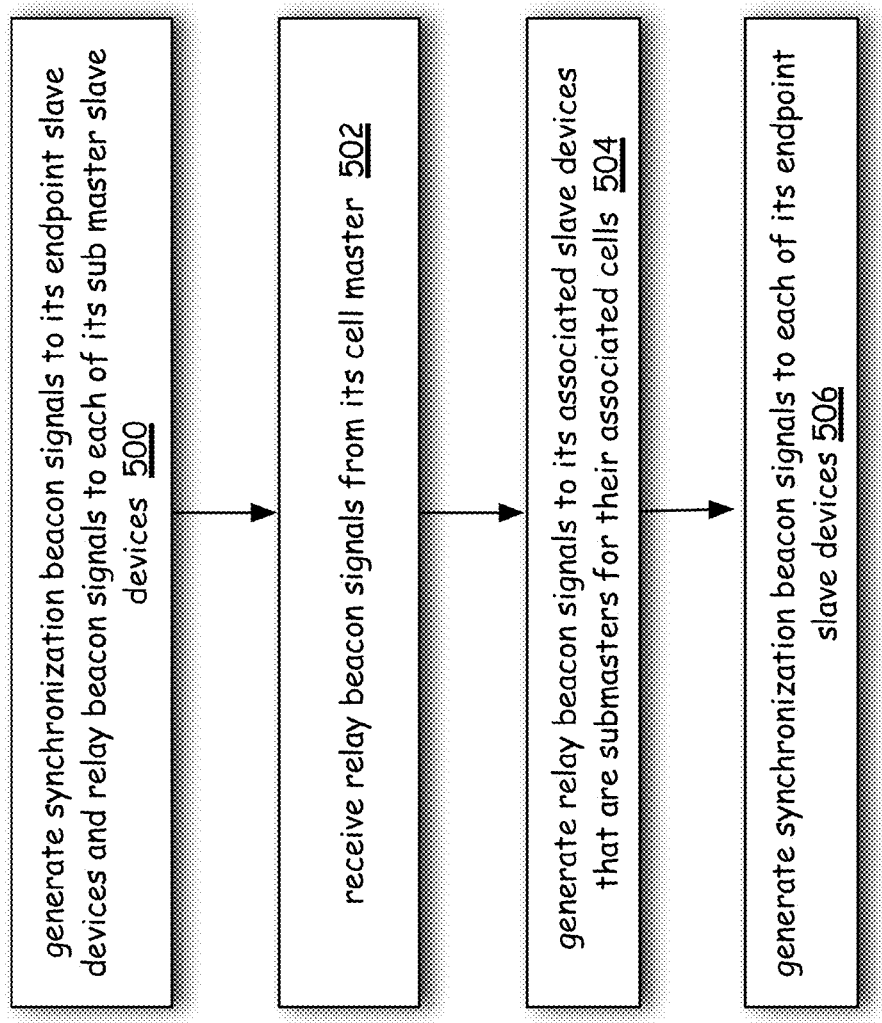
FIGS. 18-20 are flow charts that illustrate various method steps for various embodiments of the invention.
Figure 19:
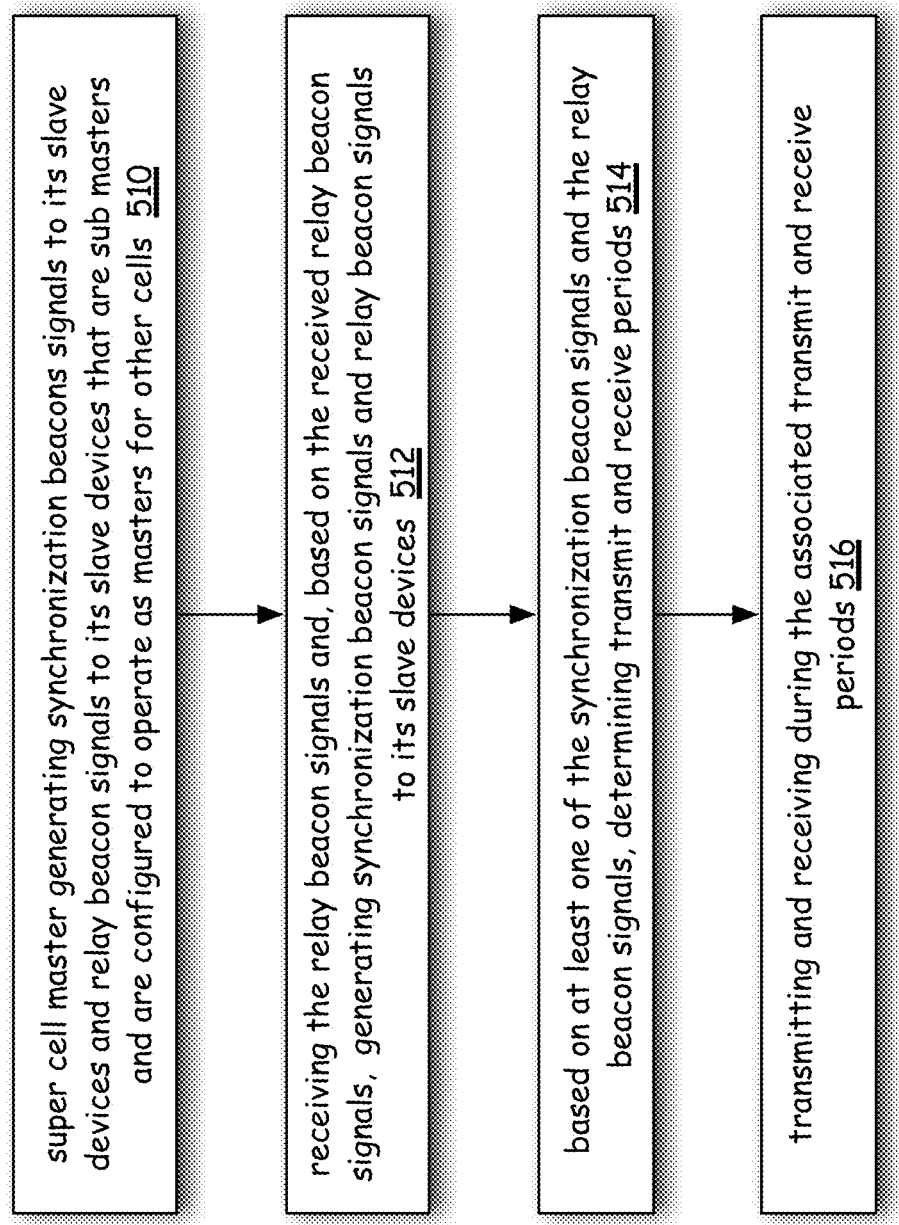
Figure 20:
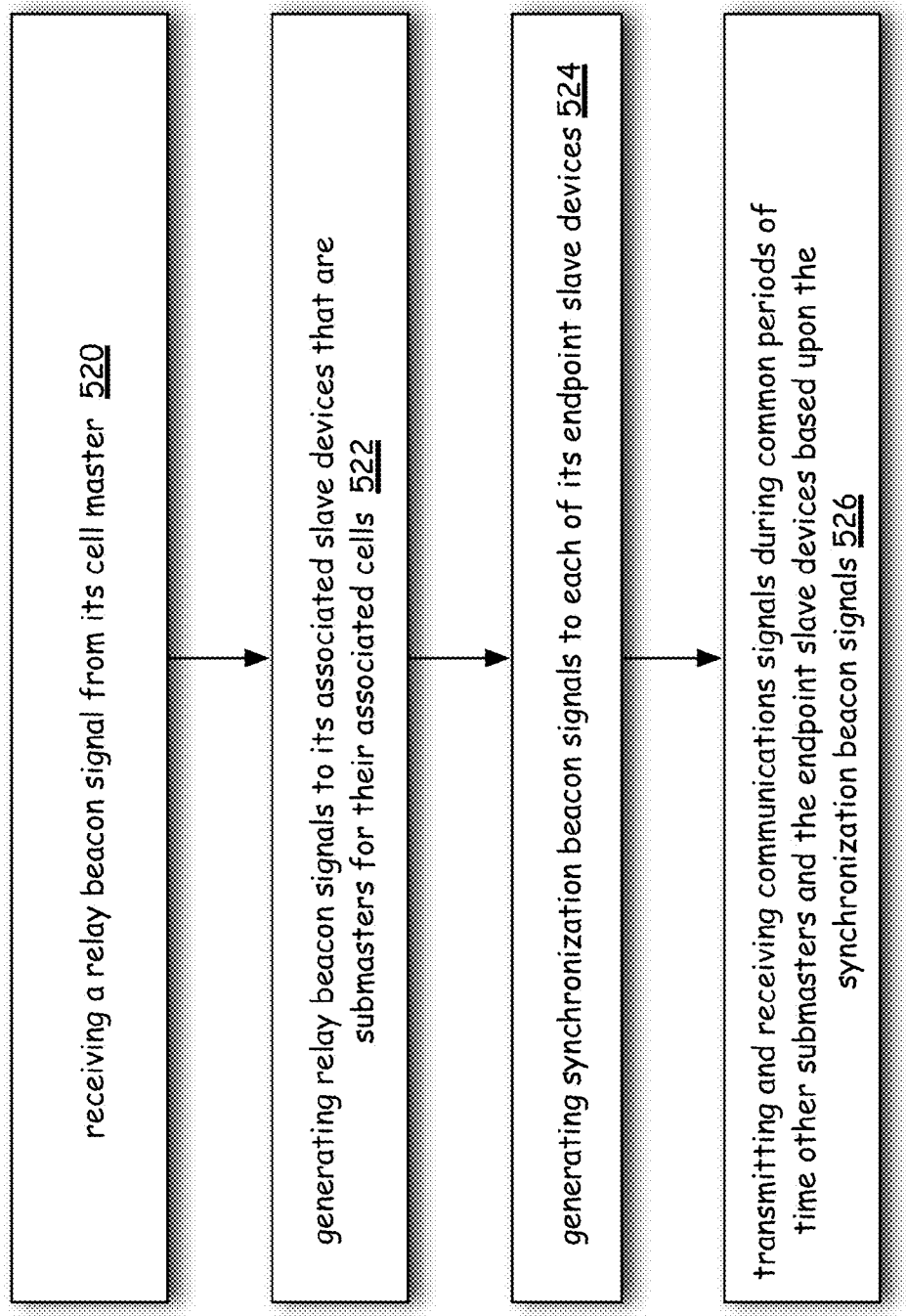

FIGS. 18-20 are flow charts that illustrate various method steps for various embodiments of the invention. In FIG. 18, the method includes generating synchronization beacon signals to its endpoint slave devices and relay beacon signals to each of its sub master slave devices 500. Thereafter, the method includes receiving relay beacon signals from its cell master 502. In response, the method includes generating relay beacon signals to its associated slave devices that are sub masters for their associated cells 504. Finally, the method includes generating synchronization beacon signals to each of its endpoint slave devices 506.

An alternative embodiment of an inventive method is shown in FIG. 19. In FIG. 19, the method commences with the super cell master generating synchronization beacons signals to its slave devices and relay beacon signals to its slave devices that are sub masters and are configured to operate as masters for other cells (step 510). Thereafter, the method includes receiving the relay beacon signals and, based on the received relay signals, generating synchronization beacon signals and relay beacon signals to its slave devices (step 512). Based on at least one of the synchronization beacon signals and the relay beacon signals, the method includes determining transmit and receive periods (step 514). Based on the determined transmit and receive periods, the method includes transmitting and receiving during the associated and determined transmit and receive periods (step 516).

FIG. 20 illustrates a method in a sub master according to one embodiment of the present invention. The sub master is operably disposed within a wireless data packet network that has one super cell master, a plurality of sub masters, and a plurality of end point slave devices. The method commences with the sub master receiving a relay beacon signal from its cell master (step 520). Thereafter, the method includes the sub master generating relay beacon signals to its associated slave devices that are also sub masters for their associated cells and slave devices (step 522). Thereafter, the method includes generating synchronization beacon signals each of the in point slave devices of the sub master (step 524). Finally the method includes the sub master transmitting and receiving communication signals during time and periods of time as other sub masters and in point slave devices, all based upon the synchronization beacon signals (step 526).

One aspect of the embodiment of the invention shown in FIG. 20 is that the method includes the synchronization beacon signals being synchronized and transmitted with the synchronization beacon signals generated by the super cell master. Additionally, another aspect of the embodiment of the invention is that the synchronization beacon signals are generated at different frequencies in relation to other sub masters but wherein the relay beacon signals are transmitted at the same frequency between masters and slaves within a cell.

Figure 21:
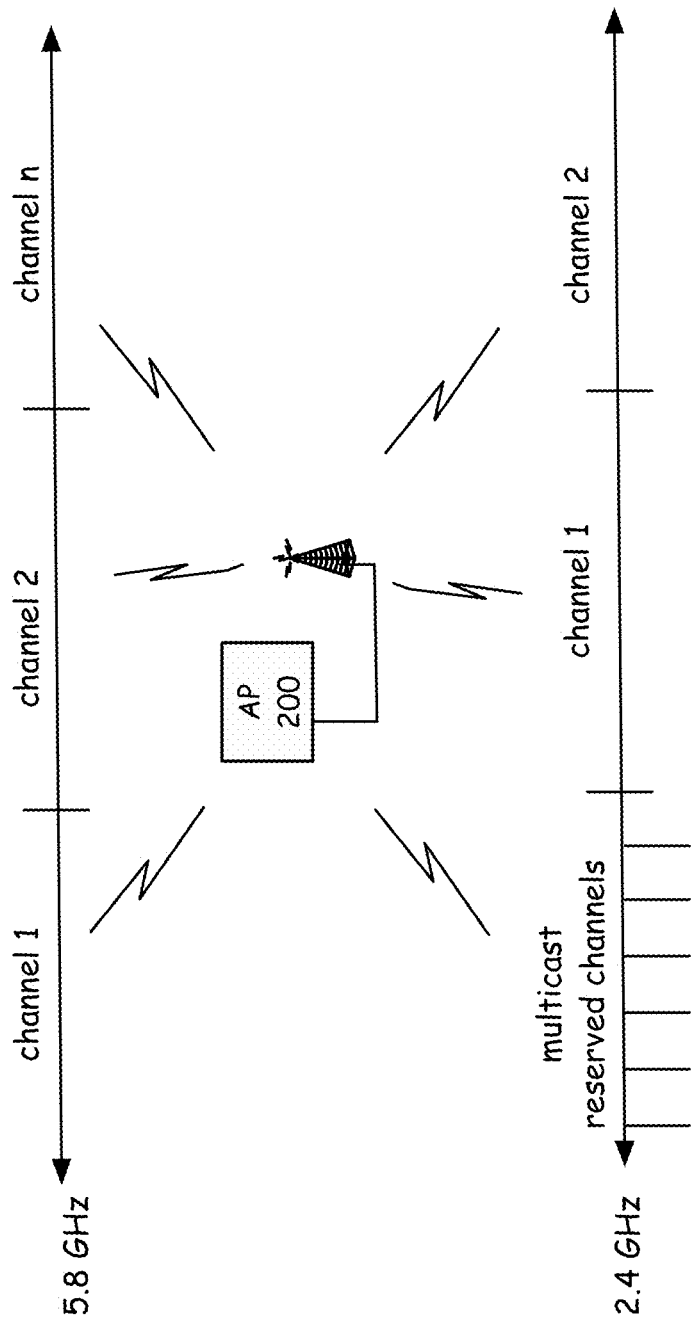
FIG. 21 is a functional diagram that illustrates one embodiment of the invention of a combined communication system that utilizes traditional WLAN protocols and multicast communication protocols.

FIG. 21 is a functional diagram that illustrates one embodiment of the invention of a combined communication system that utilizes traditional WLAN protocols and multicast communication protocols. Generally, it is understood in the art that only three of a plurality of channels, e.g., thirteen 2.4 GHz WLAN channels, may be used at one time to carry large payloads without interference. Thus, a WLAN device is typically shown having three 2.4 GHz channels and a number of channels in the 5.8 GHz band. In one embodiment of the present invention, one of the three 2.4 GHz WLAN channels is reserved for multicast protocol transmissions according to the various embodiments of the invention. Thus, a WLAN access point, according to one embodiment, includes radio circuitry configured to communicate according to 802.11 communication protocols in all defined 802.11 channels except a reserved channel and to communicate using a multicast protocol as described herein this disclosure in the reserved channel. In the described embodiment, the reserved channel is an ISM band channel in the range of 2.4 GHz to 2.48 GHz.

Thus, a WLAN device may utilize two of the 2.4 GHz wideband channels for carry large amounts of data (e.g., HDTV to large HDTV monitors) and one channel of carrying a plurality of smaller (e.g., 1 or 4 MHz wide channels) for supporting communications with handheld devices. If streaming video is being delivered, a 4 MHz wide channel is adequate for carrying content to handheld devices having smaller screens. In one embodiment all of the channels for carrying the payload and control signals are 4 MHz wide channels. In an alternative embodiment, the width of the channels may very and may be as small as 1 MHz. To illustrate the point that the WLAN channels that is reserved for multicast protocol transmissions that utilize a plurality of smaller bandwidth channels, FIG. 21 illustrates six sections within the portion entitled multicast reserved channels.

In the described embodiment, the transmissions in the multicast reserved channels not only utilize a plurality of smaller 4 MHz channels (in contrast to the traditional 25 MHz wide channels of WIFI/WLAN access points), but also synchronize transmissions utilizing the vessel/container structure described above in relation to FIGS. 8-20. Thus, in an access point according to the present embodiments, the radio circuitry is configured to define a plurality of communication vessels wherein:

outgoing and ingoing communications occur during the vessels;

each vessel defines a plurality of containers;

each communication during a container is to a selected receiver; container communications may vary by frequency of transmission for both, narrowband and wideband communications; and containers used for narrowband communications are synchronized with communications for wideband communications.

It should be understood, that the access point, in this embodiment, generates a synchronization beacon and a relay beacon it each of its slave devices. All of these multicast protocol communications occur in the multicast reserved channels. It should also be understood that these containers are not the same as traditional TDMA time slots because a given container can be varied by data rate, frequency and direction. Moreover, TDMA type multiple access schemes may be utilized within a container.

According to the embodiments for the multicast protocol, if the access point receives a communication signal for a particular device in one of the multicast reserved channels, the access point will determine whether to forward the received communication signals externally or to one of its slave devices using a multicast reserved channel for multicast communications. As described before, all of the communication devices that operate according to the multicast communication protocol that are within a cell area served by the access point will transmit and receive communication signals in a synchronized manner. Another aspect of the embodiment of the present invention is that the wireless access point utilizes two frequency-hopping tables. One is for the multicast protocol communications in the multicast reserved channel. This frequency-hopping table has 16 entries. The second frequency-hopping table is for the standard wideband WLAN communications and includes 15 entries.

In operation, the access point is configured to upload a plurality of voice sources from any one of announcers, players, referees, coaches and sportscasters utilizing the multicast communication protocol reserved channel. The access point is further configured to transmit to remote receivers utilizing the reserved multicast communication protocol in the dedicated channel. The access point is further configured to broadcast transmit at least one of the uploaded voice sources to a plurality of receivers utilizing the multicast communication protocol in a broadcast transmission format. Here, the circuitry is configured to only transmit the broadcast transmissions in a synchronized manner during a specified transmit periods in a system that has alternating transmit and receive time periods as described here in. Because of the nature of the communications of the multicast communication protocol, wherein transmit and receive windows are defined in addition to the use of a frequency-hopping algorithm, and also the use of CDMA technology for certain types of transmissions to avoid collisions, a communication system operates with a minimal or non-existent level of interference. Accordingly, the broadcast transmissions may be made without using any type of ARQ or other error correction thereby allowing all receivers to stay in synchronization.

If the inventive access point were to be used within a home, however, the usage would be different but the operations would be similar. For example, the multicast reserved channels could service multicast protocol hand held devices while utilizing standard WLAN channels and protocols to deliver streaming HDTV content to HDTV compatible display devices and other devices that do not support the multicast communication protocol.

Figure 22:
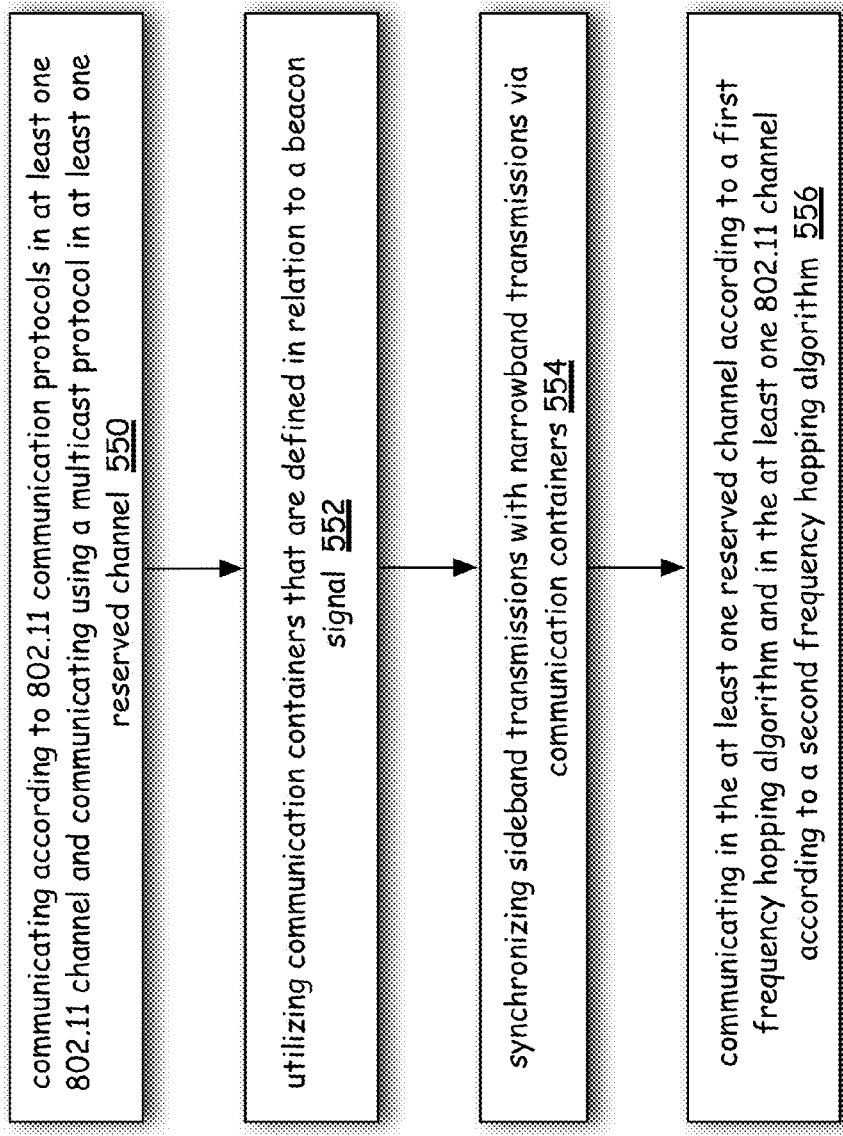
FIGS. 22 and 23 flow chart that illustrate various methods according to embodiments of the invention.
Figure 23:
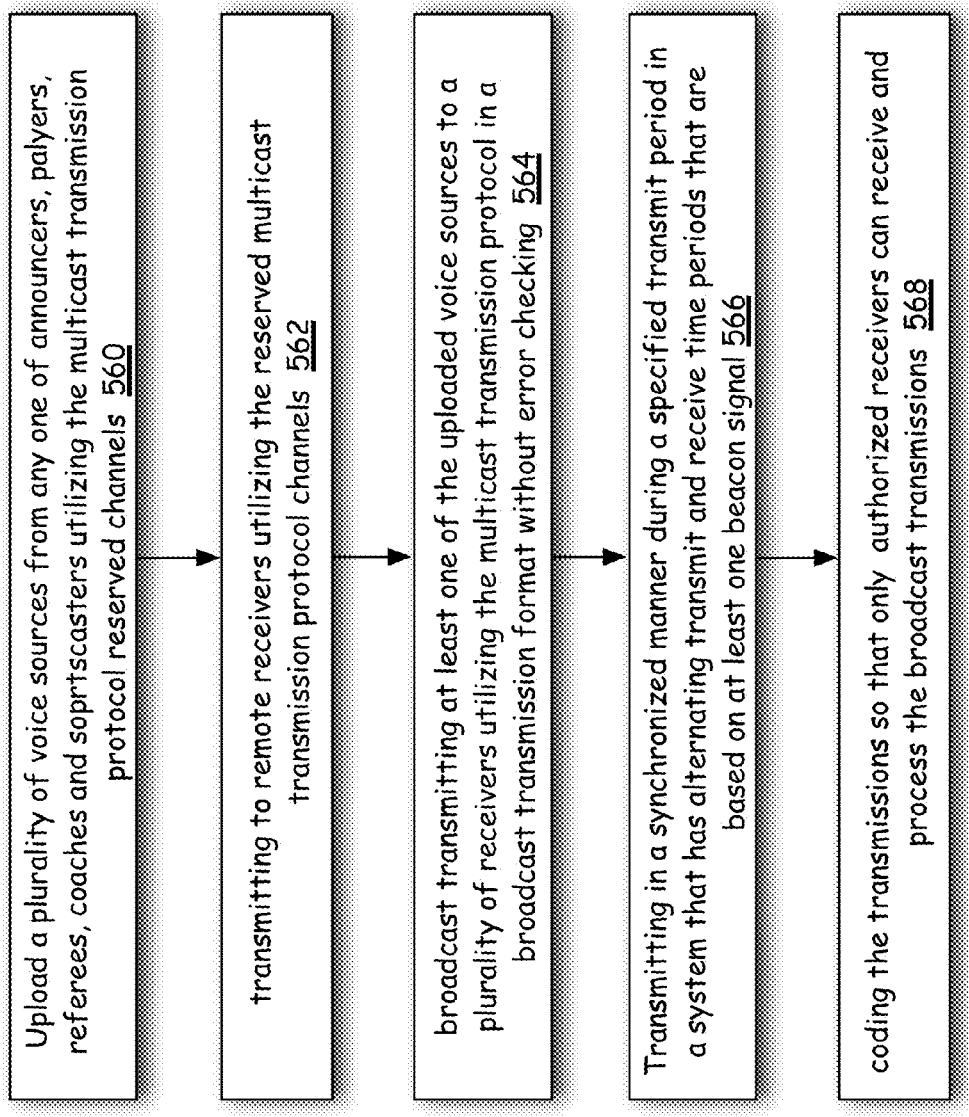

FIGS. 22 and 23 flow chart that illustrate various methods according to embodiments of the invention. Referring to FIG. 22, a method within an access point, comprises communicating according to 802.11 communication protocols in at least one 802.11 channel and communicating using a multicast protocol in at least one reserved channel (step 550). The method further includes utilizing communication containers that are defined in relation to a beacon signal (step 552). Additionally, the method includes synchronizing sideband transmissions with narrowband transmissions via communication containers (step 554). Finally, the method includes communicating in the at least one reserved channel according to a first frequency-hopping algorithm and in the at least one 802.11 channel according to a second frequency-hopping algorithm (step 556).

Generally, the reserved channel comprises a plurality of channels having a bandwidth that is less than or equal to 4 MHz. As described before, the access point generates a synchronization beacon and a relay beacon to each of its slave devices as a means of synchronizing the containers or periods for transmitting and receiving communication signals including data as well as control commands.

One aspect of the multicast communication protocol is that the protocol is simple and does not require substantial amount of memory or processing power to determine how to route outgoing communication signals. Generally, every device either forwards the communication directly to a device within the same cell or forwards the communication to its cell master that forwards the communication to the super cell master, which then makes routing determinations. Thus, the access point receives communications signals from one of its slave devices and determines whether to forward the received communication signals externally or to another one of its slave devices using the reserved channel for multicast communications. Typically, however, it will forward the communication upward towards the super cell master as the individual devices within a cell can communicate directly with each other.

FIG. 23 illustrates a method according to one embodiment of the invention. In a large venue environment, the access point is configured to upload a plurality of voice sources from any one of announcers, players, referees, coaches, and sportscasters utilizing the multicast transmission protocol reserve channel (step 560). The method further optionally includes transmitting to remote receivers utilizing the reserved multicast transmission protocol channel (step 562). The method also includes broadcast transmitting at least one of the uploaded voice sources to a plurality of receivers utilizing the multicast transmission protocol in a broadcast transmission format without ARQ or another other type of error checking (step 564). The method further includes transmitting outgoing signals in a synchronized manner during a specified transmit period in a system that has alternating transmit and receive time periods that are based on at least one beacon signal (step 566). Finally, the method includes coding the transmissions so that only authorized receivers can receive and process the broadcast transmissions (step 568). This step allows the creation of different groups of users that have access to different broadcast channels.

Figure 24:
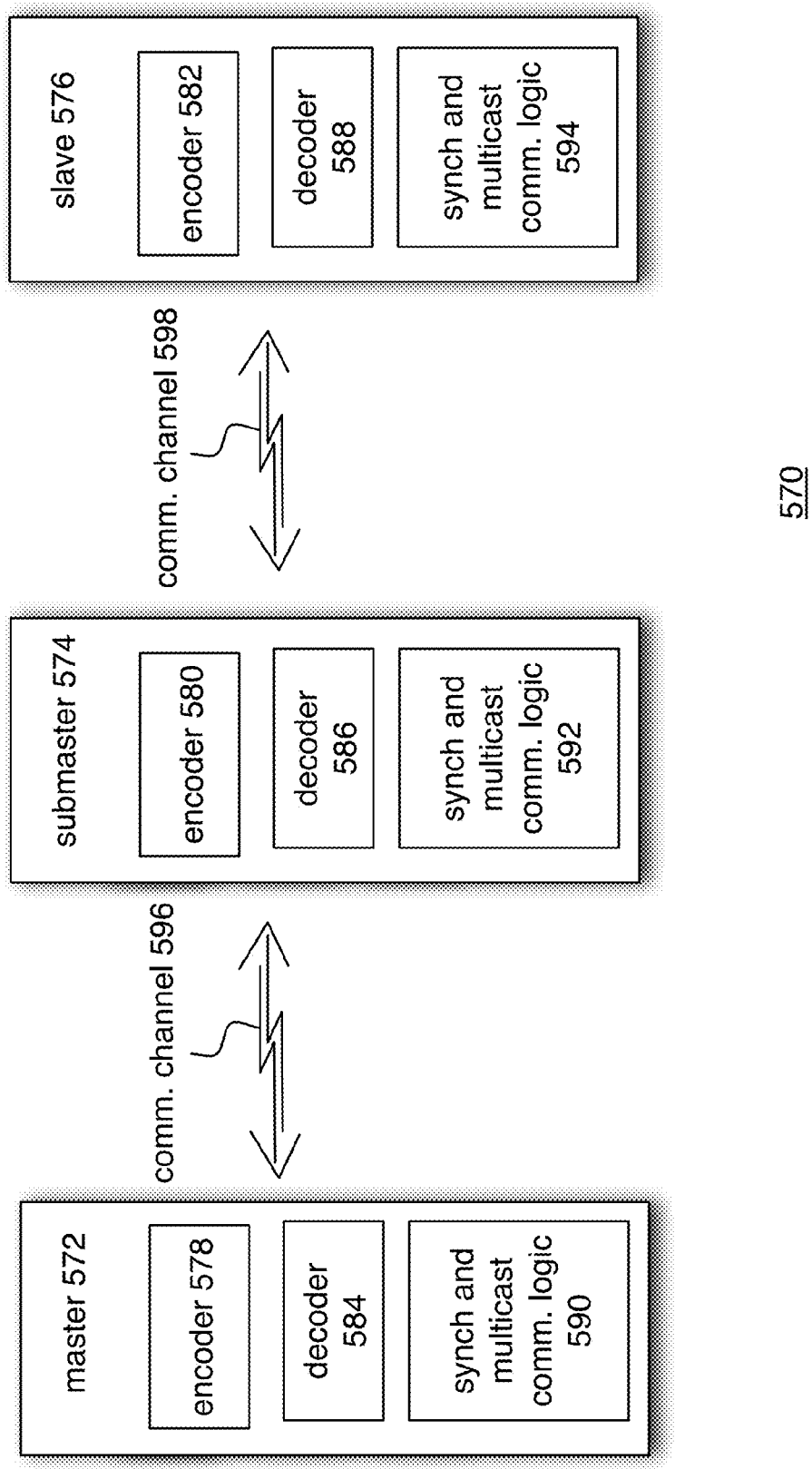
FIG. 24 is a functional block diagram of a communication system with error correction logic according to one embodiment of the invention.

FIG. 24 is a functional block diagram of a communication system with error correction logic according to one embodiment of the invention. Referring to FIG. 24, the communication system 570 includes a super cell master 572 that is configured to communicate with one or more sub masters 574 and one or more slave devices 576. Generally, each of master 572, sub master 574 and slave device 576 includes an error correction encoder 578, 580, and 582, respectively. Similarly, each of the three devices shown includes a decoder 584, 586 and 588, respectively. Finally, each includes synchronization and multicast communication logic 590, 592 and 594, respectively. Synchronization and multicast communication logic 590-594 define the operational logic to support the various methods and operation according to the embodiments of the invention as described here in this specification. As may be seen, master 572 communicates with sub master 574 via communication channel 596. Sub master 574 communicates with slave device 576 via communication channel 598.

In operation, when any one of master 572, sub master 574, or slave device 576 transmits communication signals including digital data to each other or to other devices within a cell that operates according to the various embodiments of the synchronization and multicast communication logic described herein this specification, the transmitting device, and more particularly, the encoder 578-582, will encode the outgoing digital data as described herein according to the embodiments of the present invention. This logic will be described in association of the figures that follow. Similarly, each device that receives coded digital data will utilize the logic within decoder 584-588 to decode the in-going coded digital data according to the various embodiments of the invention as described in association with figures that follow.

Figure 25:
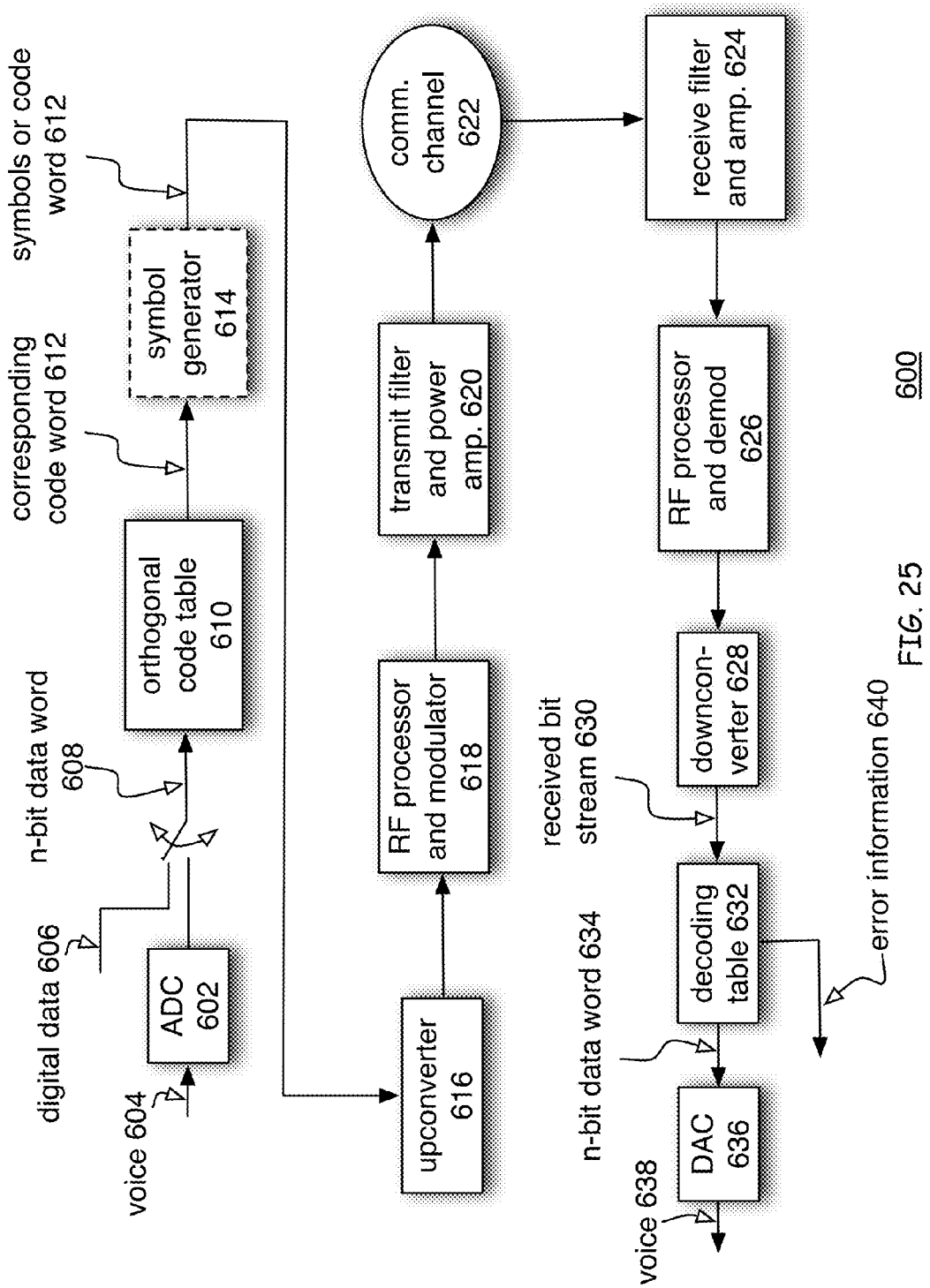
FIG. 25 is a communication system according to one embodiment of the present invention.

FIG. 25 is a communication system according to one embodiment of the present invention. It should be noted that a portion of the system 600 of FIG. 25 is operably disposed within a transmitter and a portion is operably disposed within a receiving receiver. In between the two, is a communication channel but communicatively couples the two. Referring now to FIG. 25, an analog-to-digital converter (ADC) 602 is coupled to receive analog voice 604 and is configured to produce a digital representation of analog voice 604. In the described embodiment, the digital voice is produced to a switch that is configured to select between the output of ADC 602 and digital data 606. The output of the switch as shown in FIG. 25 is n-bit data word 608. In the described embodiment of the invention, the n-bit data word 608 is produced to an orthogonal code table 610 that produces a corresponding orthogonal code word 612. In the described embodiment of the invention, every four bits of the data word 608 is represented by a corresponding orthogonal code word 612 that is eight bits long.

In one embodiment of the invention, the output of code table 610, namely the corresponding code word 612, is produced to a symbol generator 614. Depending on the type of modulation, this step is optional. Accordingly, the downstream signal is shown as symbols or code word 612. In the described embodiment, digital signals are transmitted directly without conversion to analog. Alternatively, however, such outgoing signals may be converted to analog prior to being processed by outgoing radio frequency (RF) processing circuitry. Here, code word 612 is produced to an up converter 616 which then produces up converted signals to RF processor and modulator block 618. The output of RF processor and modulator block 618 is then produced to a transmit filter and power amplifier 620. The preceding portion of system 600 has been the transmitter portion of the communication system 600. After being power amplified, the outgoing RF signal is radiated from an antenna (not shown) to be delivered to a receiver via a communication channel 622.

Within the receiver portion of system 600, an in-going RF signal is received, filtered and amplified by a receive filter and amplifier 624. The output of receive filter and amplifier 624 is then produced to an RF processor and modulator 626 that amplifies and filters the in-going RF signal. The amplified and filtered in-going RF signal is then produced to a down-converter 628 that generates a received bit stream 630. The received bit stream 630 is produced to a decoding table 632 that subsequently produces n-bit data word 634. Data word(s)

634 is/are then produced to a digital-to-analog converter 636 that produces analog voice 638. As will be described in greater detail below, decoding table 632, because it includes 16 orthogonal codes and permutations of the 16 orthogonal codes with one bit error, is able to produce a data word even if the received code has one bit error. In the described embodiment, the decoding table has 16 orthogonal codes and 128 codes that are the equivalent of one of the 16 orthogonal codes with one bit error. For each of these values, there is an associated 4-bit code. If the received bit stream has two or more bit errors, decoding table 632 is not able to determine what the data word 634 should be and therefore generates error information 640.

Figure 26:
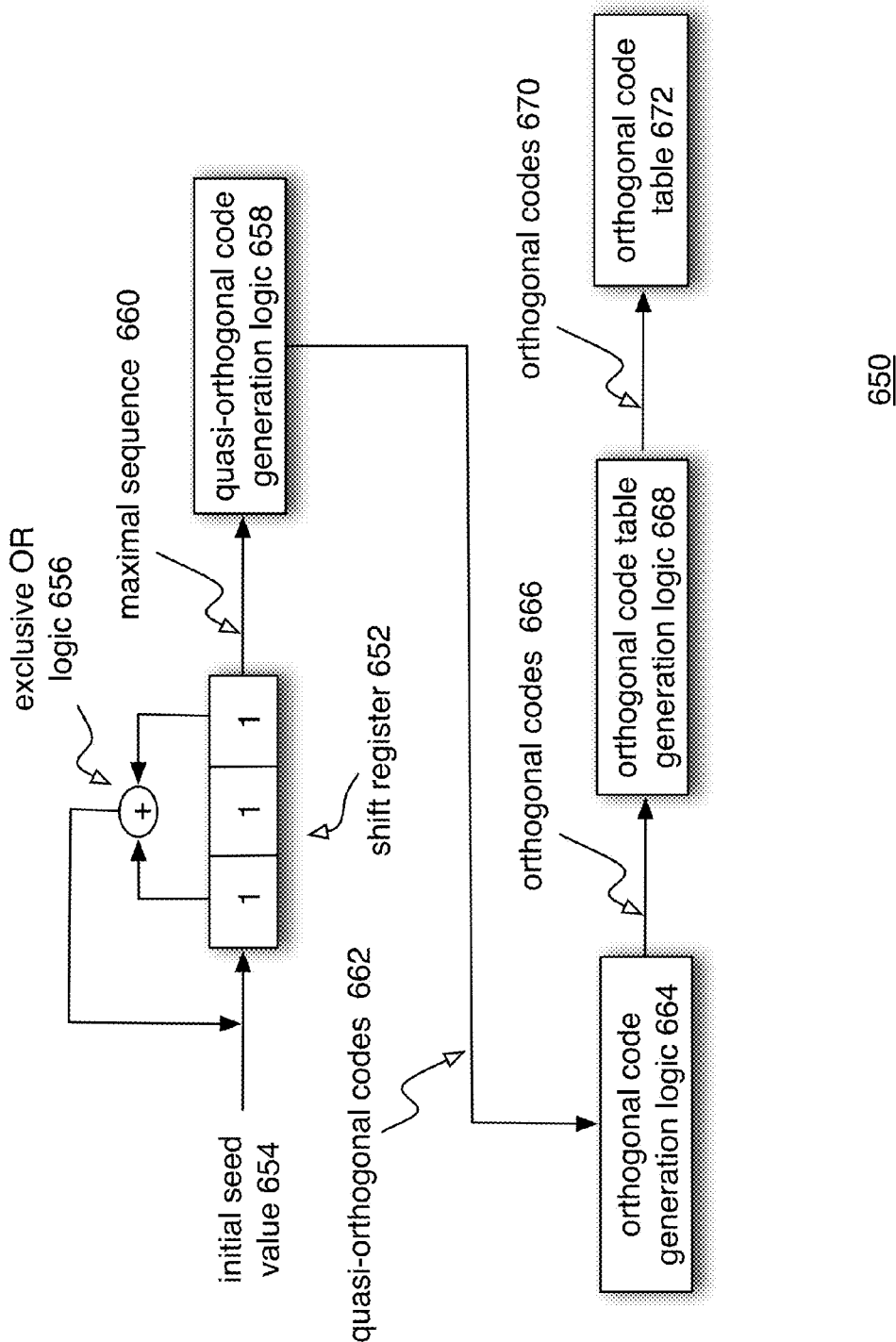
FIG. 26 is a functional block diagram of a logic system for generating and orthogonal code table according to one embodiment of the present invention.

FIG. 26 is a functional block diagram of a logic system for generating and orthogonal code table according to one embodiment of the present invention. Logic shown generally at 650 includes a shift register 652 that is coupled to receive an initial seed value 654. The initial seed value populates the registers of shift register 652. For the described embodiment, shift register 652 is a 3-bit long shift register. The initial seed value, in one embodiment of the present invention, is the three digit binary number 111. The values of the first register and third register are both produced to exclusive OR (XOR) logic 656. The output of XOR logic 656 then becomes the input to shift register 652. Whenever a shift occurs and the output value of logic 565 is input to shift register 652, a right shift occurs and the output of shift register 652 is also produced to quasi-orthogonal code generation logic 658. It should be noted that the output of shift register 652 is a maximal sequence 660. Quasi-orthogonal code generation logic 658 is configured to produce 7-bit long quasi-orthogonal codes 662 based upon the received maximal sequence 660.

The quasi-orthogonal codes 662 are then produced to orthogonal code generation logic 664, which is configured to add a "0" at the end of each of the received quasi-orthogonal codes 662. Orthogonal code generation logic 664 then produces orthogonal codes 666 to orthogonal code table generation logic 668. Orthogonal code generation logic 668 builds a table of seven received orthogonal codes and then adds an additional eight-bit code of all "0" or all "1" values. Thereafter, orthogonal code table generation logic 668 is configured to duplicate the eight codes that are each eight-bits long with opposite logic states. In other words, every bit value of the eight orthogonal codes is replaced by its logical opposite in the second group of eight codes. To illustrate for a three-bit word, a code word of 101 would be duplicated with a code word of 010. It is understood that a three-bit word is used for this example for simplicity though the codes are, in the described embodiment, eight bits long.

Orthogonal code table generation logic 668 then produces 16 orthogonal codes 670 to orthogonal code table 672. Orthogonal code table 672 is configured to map each of the 16 orthogonal codes to a four-bit data pattern. Accordingly, when a 4-bit data pattern is presented for transmission, that 4-bit data pattern is used as an address to the orthogonal code table 672 to select the associated 8-bit long orthogonal code that is to be transmitted in its place.

Figure 27:
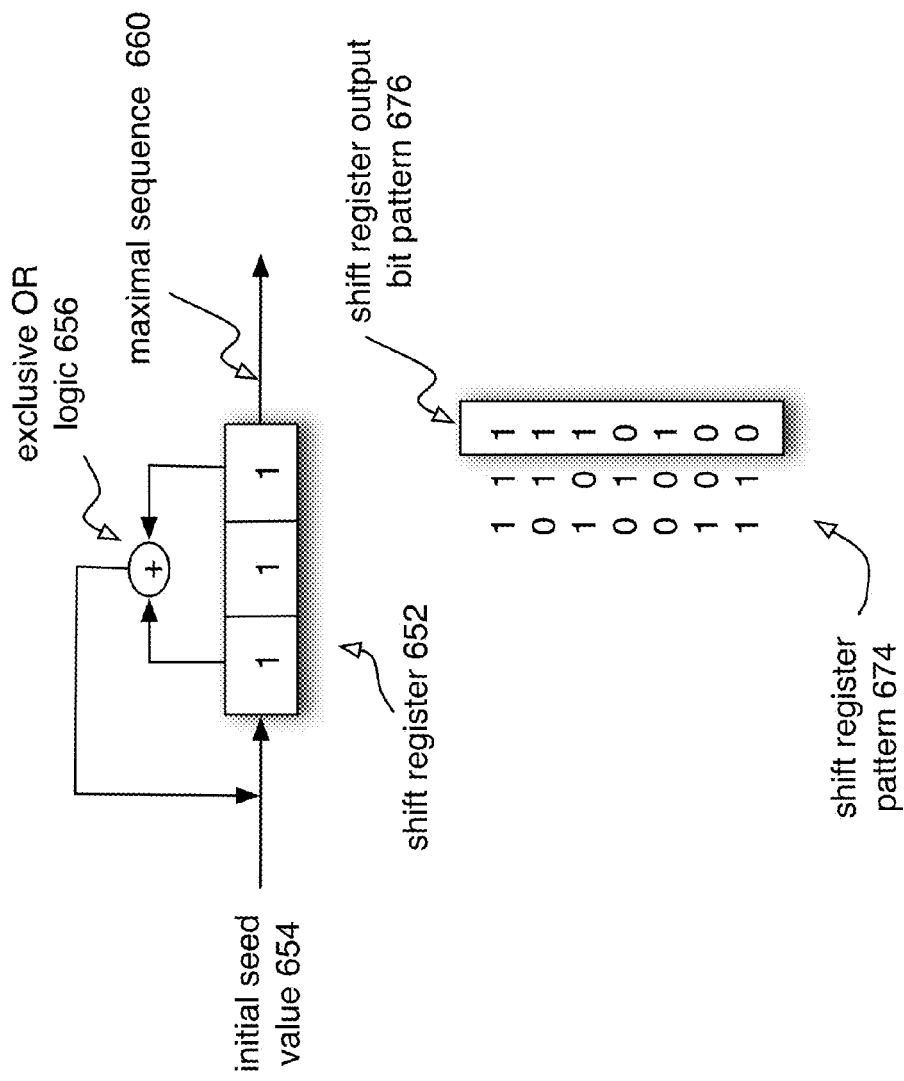
FIG. 27 illustrates one aspect of the embodiment of the present invention.

FIG. 27 illustrates one aspect of the embodiment of the present invention. Referring back to FIG. 26, and initial seed value 654 is inserted into shift register 652 that produces maximal sequence 660 as described in FIG. 26. The maximal sequence 660 is more clearly illustrated in the portion of the figure below the shift register. For a shift register bit pattern shown generally at 674, a shift register output bit pattern 676 is highlighted with a box. The shift register output bit pattern then is the maximal sequence and (after 7 bits), becomes the quasi-orthogonal code that is seven bits long.

Figure 28:
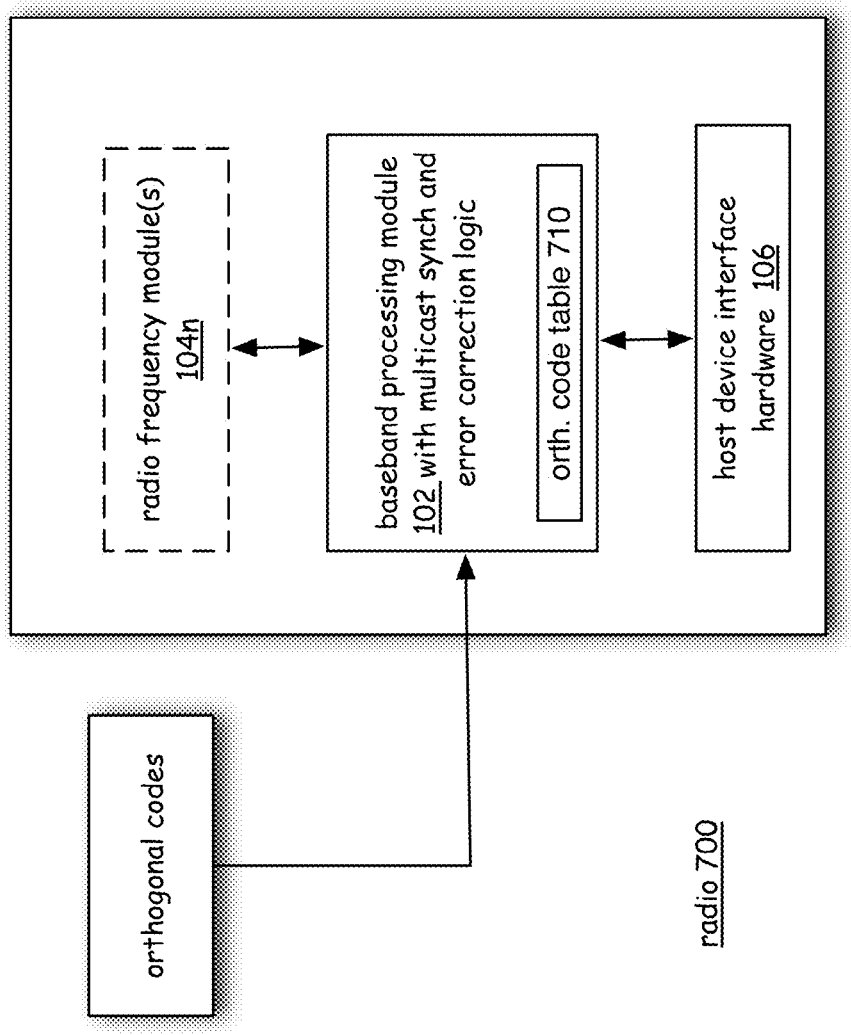
FIG. 28 is a functional block diagram of a radio according to one embodiment of the present invention.

FIG. 28 is a functional block diagram of a radio 700 according to one embodiment of the present invention. As may be seen, radio 700 is similar to the radio shown in relation to FIG. 4. In the previous discussion, logic was shown that generates the orthogonal codes that are used within an orthogonal code table for the error correction. Here, an alternative is shown in which radio 700 receives the orthogonal codes from an external source. Radio 700 is specifically configured to receive the orthogonal codes and to store them within orthogonal core code table 710. As before, the orthogonal codes of orthogonal codes 710 are associated with four-bit data patterns so that the orthogonal code may be transmitted to represent one of 16 different four-bit data patterns.

Figure 29:
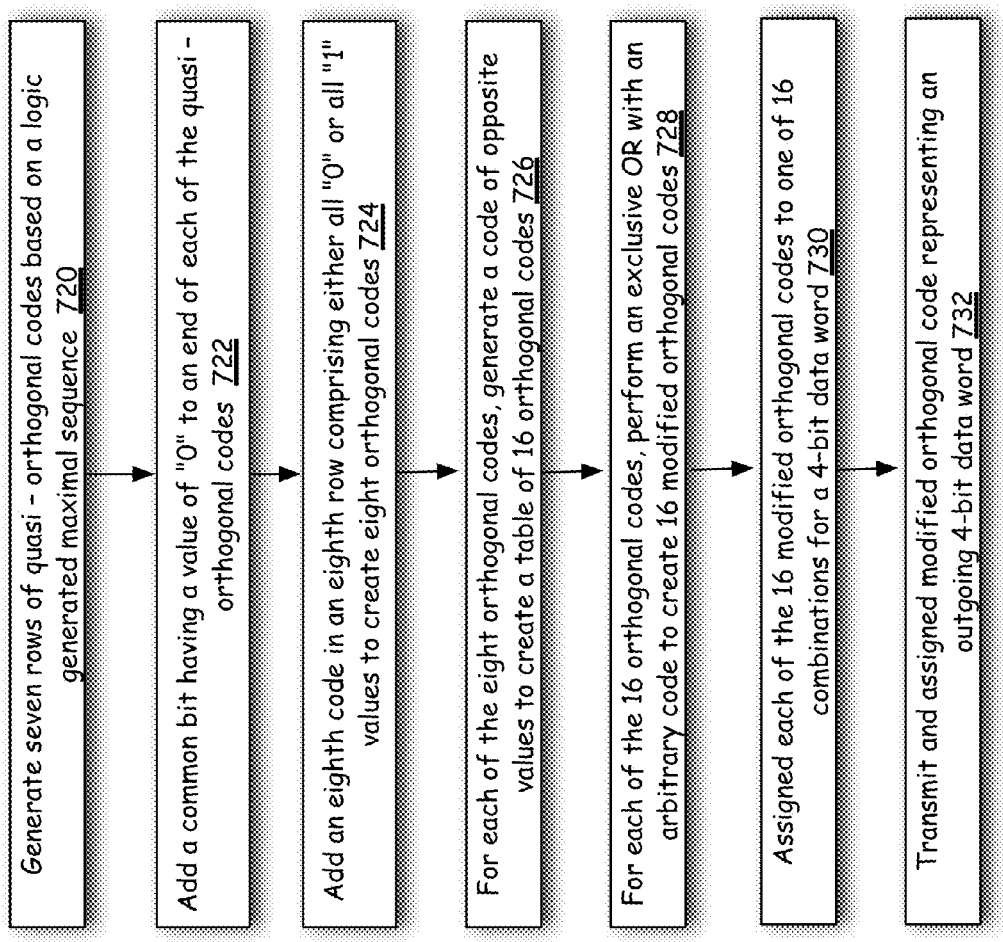
FIG. 29 is a flowchart illustrating a method of according to the present embodiment of the invention that may be performed by the hardware described in the figures above.

FIG. 29 is a flowchart illustrating a method of according to the present embodiment of the invention that may be performed by the hardware described in the figures above. Initially, a transmitter is configured to generate seven rows of quasi-orthogonal codes based on a logic generated maximal sequence (step 720). Thereafter, the transmitter is configured to add a common bit having a value of "0" two and in each quasi-orthogonal code (step 722). Thereafter, the transmitter is configured to add an eighth code in an eighth row that comprises either all "0" or all "1" values to create eight orthogonal codes (step 724). As a part of generating the orthogonal codes, the transmitter is further configured to, for each of the 8 orthogonal codes, generate a code of opposite values to create a table of 16 orthogonal codes (step 726). For each of the 16 orthogonal codes, in one embodiment of the invention, the transmitter is configured to perform an XOR with an arbitrary code to create 16 modified orthogonal codes (step 728).

Thereafter, the transmitter is configured to assign each of the 16 modified orthogonal codes to one of 16 combinations for a four-bit data word (step 730). Finally, the method includes the transmitter being configured to transmit and assigned modified orthogonal code representing an outgoing 4-bit data word (step 732).

Figure 30:
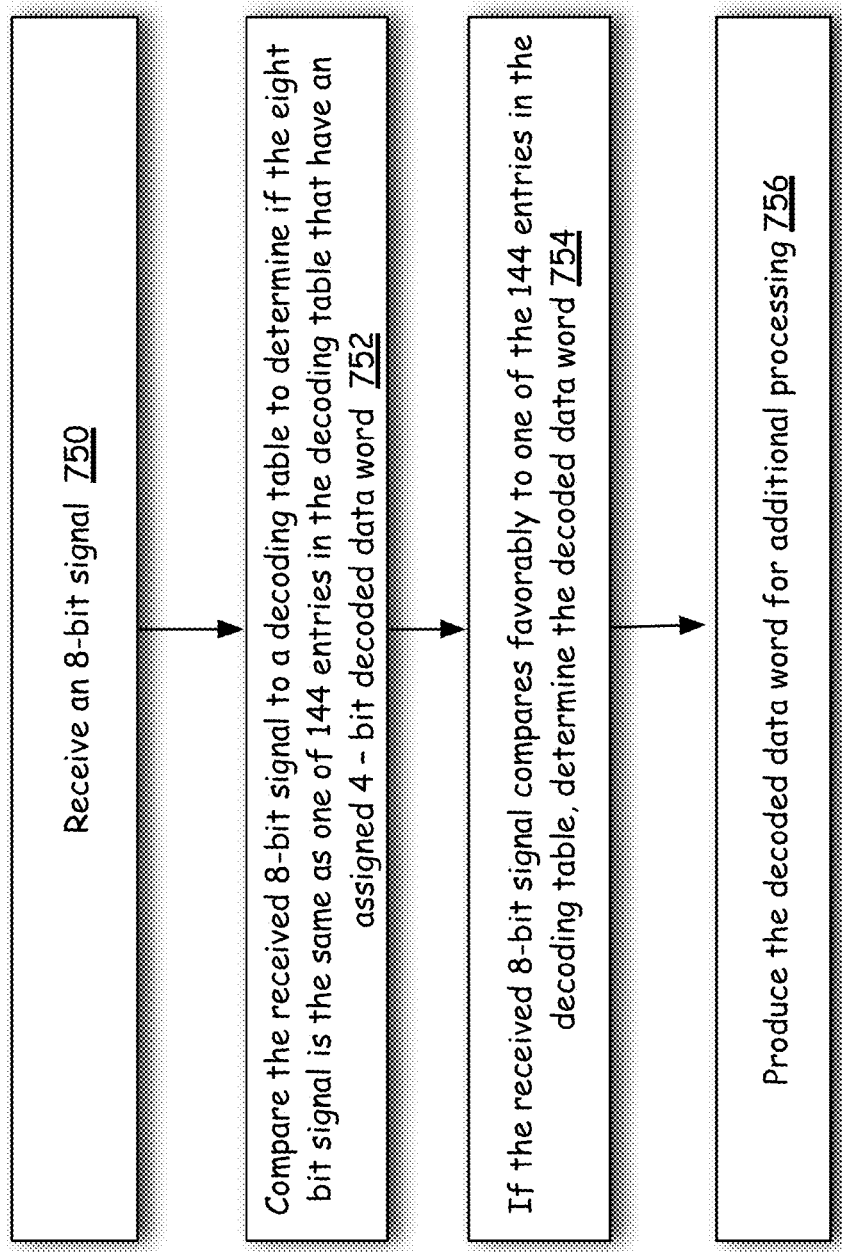
FIG. 30 is a flowchart illustrating a method for decoding a received 8-bit signal according to one embodiment of the invention.

FIG. 30 is a flowchart illustrating a method for decoding a received 8-bit signal according to one embodiment of the invention. The method includes a receiver being configured to receive an 8-Bit signal (step 750). Thereafter, the receiver is configured to compare the received eight-bit signal to a decoding table to determine if the eight-bit signal is the same as one of 144 entries in the decoding table that have an assigned four-bit decoded data word (step 752). The receiver further includes logic and is configured to determine that if the received eight-bit signal compares favorably to one of the 144 entries in the decoding table, to determine the decoded data word (step 754). Finally, the receiver is configured to produce the decoded data word for additional processing (step 756). While not shown here, one embodiment of the invention includes the receiver further producing an error indication if the 8-bit signal does not compare favorably to one of the 144 entries in the decoding table. This result occurs whenever the 8-bit signal is received with two or more bit errors.

Figure 31:
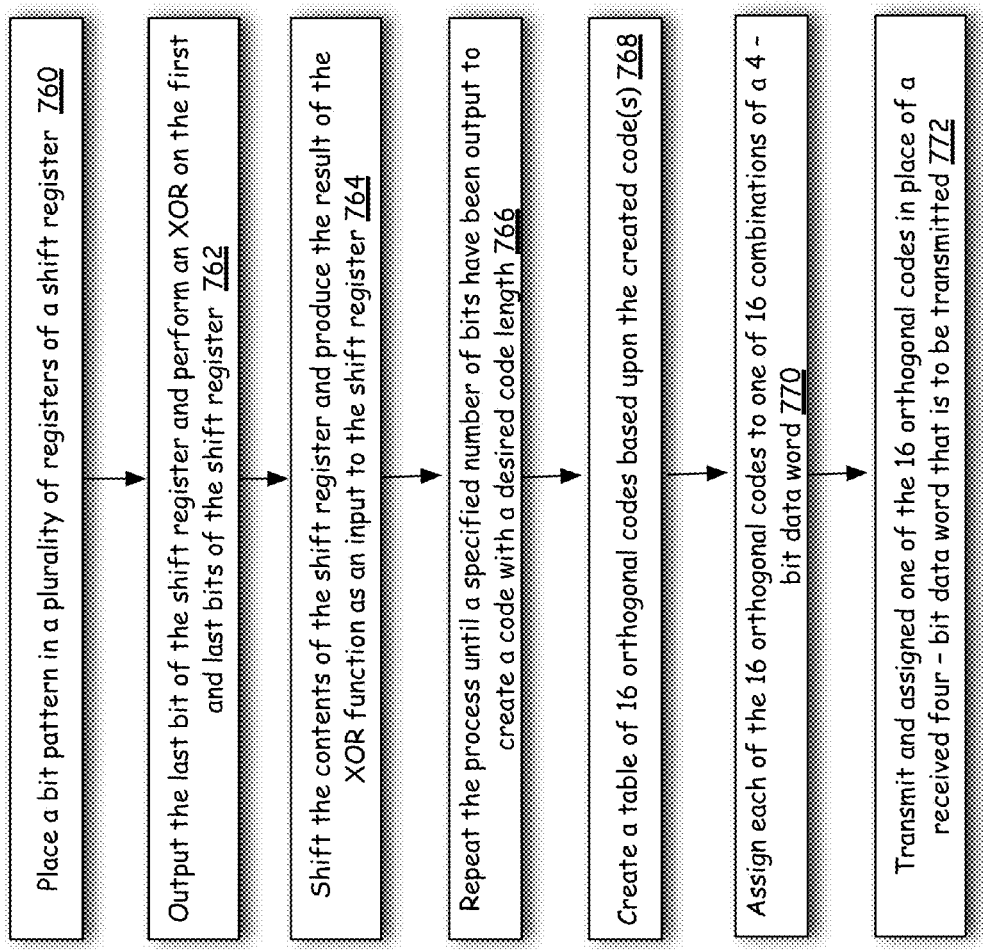
FIG. 31 is a flowchart illustrating a method for generating a table of orthogonal codes to be used in place of outgoing data bit patterns according to one embodiment of the invention.

FIG. 31 is a flowchart illustrating a method for generating a table of orthogonal codes to be used in place of outgoing data bit patterns according to one embodiment of the invention. The method begins with a transmitter being configured to place a bit pattern into a plurality of registers of a shift register (step 760). The output of the shift register is the last, or rightmost bit, wherein the logic includes the output of the shift register being produced to an XOR gate for a XOR operation with a first bit in the shift register. In essence, the first and last bits of the shift register are exclusively ORed with each other (step 762). The method further includes the logic shifting the contents of the shift register and producing the result of the XOR function as an input to the shift register (step 764). The process is repeated until a specified number of bids have been output to create a code with a desired code length (step 766). In the described embodiment, the logic is configured to produce 7-bit long quasi-orthogonal codes.

The method further includes the logic creating a table of 16 orthogonal codes based upon the created quasi-orthogonal codes (step 768). The logic is further configured to assign each of the 16 orthogonal codes to one of 16 combinations of a 4-bit data word (step 770). Finally, the method includes the transmitter and/or logic being configured to transmit and assigned one of the 16 orthogonal codes in place of a received four-bit data word that is to be transmitted (step 772). In one embodiment, as described before, a four-bit data pattern is used as an address to the table of 16 orthogonal codes. One aspect of transmitting the orthogonal codes is that they create robustness and community to single bit errors during the transmission.

The preceding discussion has presented a method and apparatus for a radio transceiver that operates according to a multicast protocol. As one of average skill in the art will appreciate, other embodiments may be derived from the teaching of the present invention, without deviating from the scope of the claims. As described before, the synchronization beacon defines transmit and receive Windows for transmitting and receiving the communication signals. These transmit and receive windows are described above in the discussion regarding vessels and containers.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a message but may adjust its current level, voltage level, and/or power level.

As may further be used herein, inferred coupling (i.e., where one element is coupled to another element by inference) includes direct and indirect coupling between two items in the same manner as "coupled to." As may even further be used herein, the term "operable to" indicates that an item includes one or more of power connections, input(s), output (s), etc., to perform one or more its corresponding functions and may further include inferred coupling to one or more other items. As may still further be used herein, the term "associated with," includes direct and/or indirect coupling of separate items and/or one item being embedded within another item. As may be used herein, the term "compares favorably," indicates that a comparison between two or more items, messages, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

What is claimed is:

1. A method for generating a signal based upon an error correction code, comprising:

generate seven rows of quasi-orthogonal codes, each code of the seven rows of quasi-orthogonal codes based on a logic generated maximal sequence;

add a common bit having a value of "0" to an end of each of the quasi-orthogonal codes;

add an eighth code in an eighth row comprising either all "0" or all "1" values;

for each of the eight codes, generate a code of opposite values to create a table of 16 orthogonal codes;

for each of the 16 orthogonal codes, perform an XOR with an arbitrary code to create 16 modified orthogonal codes;

assign each of the 16 modified orthogonal codes to one of 16 bit combinations for a 4-bit data word; and transmit an assigned modified orthogonal code representing an outgoing 4-bit data word.

2. The method of claim 1 further including receiving a 4-bit data word and selecting the assigned orthogonal code that corresponds to the 4-bit data word.

3. The method of claim 1 wherein the eighth code consists of all "0" values.

4. The method of claim 1 wherein the eighth code consists of all "1" values.

5. A method for processing a received signal having an error correction code, comprising:

receiving an eight-bit signal;

comparing the received eight bit signal to a decoding table to determine if the eight bit signal is the same as one of 144 entries in the decoding table that have an assigned 4-bit decoded data word; and if the received eight bit signal compares favorably to one of the 144 entries in the decoding table, decoding the received eight-bit signal to determine a decoded data word.

6. The method of claim 5 wherein 16 of the entries in the coding table include entries that correspond to 16 orthogonal codes and wherein any received eight bit signal that corresponds to one of the 16 orthogonal codes was received without error.

7. The method of claim 5 wherein 128 entries in the coding table include entries that correspond to 16 orthogonal codes with 1 bit error and wherein any received eight bit signal that corresponds to one of the 128 entries of the 16 orthogonal codes with one bit error has a corresponding 4 bit data word that further corresponds to a corresponding orthogonal code.

8. The method of claim 5 wherein each of 16 4-bit data word patterns has a corresponding 16-bit orthogonal code word and eight 16-bit orthogonal code words with 1 bit error in the decoding table.

9. The method of claim 5 wherein the decoding table has 112 entries that correspond to one of the 16 orthogonal codes with 2 or more bit errors.

10. The method of claim 5 wherein the decoding table has 112 entries that do not have an associated 4-bit data word.

11. The method of claim 5 wherein the decoding table has a size of 256×6 not including an address field for each of the 256 rows.

12. The method of claim 5 further including producing the 4-bit decoded data word based on the received 8 bit signal corresponding to one of 144 entries in the decoding table.

13. A method for transmitting and processing a signal based upon an error correction code, comprising:
  placing a bit pattern in a plurality of registers of a shift register;
  outputting the last bit from the shift register;
  performing an XOR function (XOR) on the first and last bits of the shift register;
  shifting the contents of the shift register and producing a result of the XOR function as an input to the shift register;
  starting with the outputting step, repeat the process until a specified number of bits have been output to create a code with a desired code length;
  create a table of 16 orthogonal codes based upon the created code;
  assign each of the 16 orthogonal codes to one of 16 bit combinations of a 4-bit data word;
  transmit an assigned one of the 16 orthogonal codes in place of a received 4-bit data word that is to be transmitted;
  receive a transmitted signal and determine if the received signal is one of the 16 orthogonal codes or one of 128 permutations of the 16 orthogonal codes with one bit error; and
  based on the determining step, produce a correspond 4-bit data word.

14. The method of claim 13 wherein the step of creating the table of orthogonal codes includes creating a table of 7 codes, each having a bit length of 7.

15. The method of claim 14 further including adding a "0" bit to each of the 7 codes to create an eight-bit code for each of the codes.

16. The method of claim 15 further including create an eighth code wherein:
  the code length is 8 bits long; and
  all of the bits have a value of "0" or "1".

17. The method of claim 16 wherein the eighth code has all "1" bits.

18. The method of claim 16 wherein the eighth code has all "01" bits.

19. The method of claim 16 further including creating a second group eight codes wherein the bit values are opposite of the original eight codes to create a table of 16 orthogonal codes.

* * * * *